United States Patent
Adibi et al.

(10) Patent No.: US 8,697,553 B2
(45) Date of Patent: Apr. 15, 2014

(54) SOLAR CELL FABRICATION WITH FACETING AND ION IMPLANTATION

(75) Inventors: Babak Adibi, Los Altos, CA (US); Edward S. Murrer, Aptos, CA (US)

(73) Assignee: Intevac, Inc, Santa Clara, CA (US)

( * ) Notice: Subject to any disclaimer, the term of this patent is extended or adjusted under 35 U.S.C. 154(b) by 715 days.

(21) Appl. No.: 12/482,685

(22) Filed: Jun. 11, 2009

(65) Prior Publication Data

US 2009/0308450 A1 Dec. 17, 2009

Related U.S. Application Data

(60) Provisional application No. 61/131,687, filed on Jun. 11, 2008, provisional application No. 61/131,688, filed on Jun. 11, 2008, provisional application No. 61/133,028, filed on Jun. 24, 2008, provisional application No. 61/210,545, filed on Mar. 20, 2009, provisional application No. 61/131,698, filed on Jun. 11, 2008.

(51) Int. Cl.
*H01L 21/425* (2006.01)
*H01L 21/00* (2006.01)
*H01L 31/00* (2006.01)

(52) U.S. Cl.
USPC ............. 438/514; 438/57; 438/533; 438/524; 136/256

(58) Field of Classification Search
USPC .......... 136/256; 257/439, E31.038, E21.334; 438/57, 73–81, 510–534; 118/620; 204/157.44; 216/58–81; 427/523–531, 427/533, 562–564, 569–579
See application file for complete search history.

(56) References Cited

U.S. PATENT DOCUMENTS

| | | |
|---|---|---|
| 3,607,450 A | 9/1971 | Kiewit |
| 3,786,359 A | 1/1974 | King |

(Continued)

FOREIGN PATENT DOCUMENTS

| | | |
|---|---|---|
| CN | 1198597 A | 11/1998 |
| CN | 1638015 A | 7/2005 |

(Continued)

OTHER PUBLICATIONS

In the Unites States Patent and Trademark Office, U.S. Appl. No. 61/033,873, filed Mar. 5, 2008, Entitled: "Use of Chained Implants in Solar Cells", First Named Inventor: Nicholas Bateman et al., Company: Varian Semiconductor Equipment Associates, Inc., Gloucester, Massachusetts.

(Continued)

*Primary Examiner* — Tamir Ayad
(74) *Attorney, Agent, or Firm* — Nixon Peabody LLP; Joseph Bach, Esq.

(57) ABSTRACT

Solar cells in accordance with the present invention have reduced ohmic losses. These cells include photo-receptive regions that are doped less densely than adjacent selective emitter regions. The photo-receptive regions contain multiple four-sided pyramids that decrease the amount of light lost to the solar cell by reflection. The smaller doping density in the photo-receptive regions results in less blue light that is lost by electron-hole recombination. The higher doping density in the selective emitter region allows for better contacts with the metallic grid coupled to the multiple emitter regions. Preferably, the selective emitter and photo-receptive regions are both implanted using a narrow ion beam containing the dopants.

13 Claims, 11 Drawing Sheets

(56) References Cited

U.S. PATENT DOCUMENTS

| | | |
|---|---|---|
| 3,790,412 A | 2/1974 | Moline |
| 3,948,682 A | 4/1976 | Bordina et al. |
| 3,969,163 A | 7/1976 | Wakefield |
| 3,969,746 A | 7/1976 | Kendall et al. |
| 3,976,508 A | 8/1976 | Mlavsky |
| 4,001,864 A | 1/1977 | Gibbons |
| 4,004,949 A | 1/1977 | Lesk |
| 4,021,276 A | 5/1977 | Cho et al. |
| 4,029,518 A | 6/1977 | Matsutani et al. |
| 4,056,404 A | 11/1977 | Garone et al. |
| 4,070,205 A | 1/1978 | Rahilly |
| 4,070,689 A | 1/1978 | Coleman et al. |
| 4,072,541 A | 2/1978 | Meulenberg, Jr. et al. |
| 4,086,102 A | 4/1978 | King |
| 4,090,213 A | 5/1978 | Maserjian et al. |
| 4,095,329 A | 6/1978 | Ravi |
| 4,116,717 A | 9/1978 | Rahilly |
| RE29,833 E | 11/1978 | Mlavsky |
| 4,131,486 A | 12/1978 | Brandhorst, Jr. |
| 4,131,488 A | 12/1978 | Lesk et al. |
| 4,141,756 A | 2/1979 | Chiang et al. |
| 4,144,094 A | 3/1979 | Coleman et al. |
| 4,152,536 A | 5/1979 | Ravi |
| 4,152,824 A | 5/1979 | Gonsiorawski |
| 4,179,311 A | 12/1979 | Athanas |
| 4,219,830 A | 8/1980 | Gibbons |
| 4,227,941 A | 10/1980 | Bozler et al. |
| 4,253,881 A | 3/1981 | Hezel |
| 4,273,950 A | 6/1981 | Chitre |
| 4,295,002 A | 10/1981 | Chappell et al. |
| 4,301,592 A | 11/1981 | Lin |
| 4,322,571 A | 3/1982 | Stanbery |
| 4,353,160 A | 10/1982 | Armini et al. |
| RE31,151 E | 2/1983 | King |
| 4,377,722 A | 3/1983 | Wested |
| 4,379,944 A | 4/1983 | Borden et al. |
| 4,404,422 A | 9/1983 | Green et al. |
| 4,421,577 A | 12/1983 | Spicer |
| 4,428,783 A | 1/1984 | Gessert |
| 4,448,865 A | 5/1984 | Bohlen et al. |
| 4,449,286 A | 5/1984 | Dahlberg |
| 4,456,489 A | 6/1984 | Wu |
| 4,479,027 A | 10/1984 | Todorof |
| 4,490,573 A | 12/1984 | Gibbons |
| 4,495,375 A | 1/1985 | Rickus et al. |
| 4,522,657 A | 6/1985 | Rohatgi et al. |
| 4,524,237 A | 6/1985 | Ross et al. |
| 4,533,831 A | 8/1985 | Itoh et al. |
| 4,539,431 A | 9/1985 | Moddel et al. |
| 4,540,843 A | 9/1985 | Gochermann et al. |
| 4,542,256 A | 9/1985 | Wiedeman |
| 4,581,620 A | 4/1986 | Yamazaki et al. |
| 4,587,430 A | 5/1986 | Adler |
| 4,589,191 A | 5/1986 | Green et al. |
| 4,633,138 A | 12/1986 | Tokiguchi et al. |
| 4,665,277 A | 5/1987 | Sah et al. |
| 4,667,060 A | 5/1987 | Spitzer |
| 4,676,845 A | 6/1987 | Spitzer |
| 4,681,983 A | 7/1987 | Markvart et al. |
| 4,719,355 A | 1/1988 | Meyers et al. |
| 4,742,381 A * | 5/1988 | Fujii ............................ 257/230 |
| 4,758,525 A | 7/1988 | Kida et al. |
| 4,828,628 A | 5/1989 | Hezel et al. |
| 4,830,678 A | 5/1989 | Todorof et al. |
| 4,834,805 A | 5/1989 | Erbert |
| 4,886,555 A | 12/1989 | Hackstein et al. |
| 4,900,369 A | 2/1990 | Hezel et al. |
| 5,009,720 A | 4/1991 | Hokuyo et al. |
| 5,112,409 A | 5/1992 | Warfield et al. |
| 5,125,983 A | 6/1992 | Cummings |
| 5,132,544 A | 7/1992 | Glavish |
| 5,290,367 A | 3/1994 | Hayashi et al. |
| 5,306,647 A | 4/1994 | Lehmann et al. |
| 5,330,584 A | 7/1994 | Saga et al. |
| 5,356,488 A | 10/1994 | Hezel |
| 5,374,456 A | 12/1994 | Matossian et al. ............ 427/570 |
| 5,421,889 A | 6/1995 | Pollock et al. |
| 5,516,725 A | 5/1996 | Chang et al. |
| 5,554,854 A | 9/1996 | Blake |
| 5,583,368 A | 12/1996 | Kenney |
| H1637 H | 3/1997 | Offord et al. |
| 5,641,362 A | 6/1997 | Meier |
| 5,693,376 A | 12/1997 | Fetherston et al. ........... 427/523 |
| 5,760,405 A | 6/1998 | King et al. |
| 5,831,321 A | 11/1998 | Nagayama |
| 5,883,391 A | 3/1999 | Adibi et al. |
| 5,885,896 A * | 3/1999 | Thakur et al. ................. 438/649 |
| 5,907,158 A | 5/1999 | Nasser-Ghodsi et al. |
| 5,932,882 A | 8/1999 | England et al. |
| 5,935,345 A | 8/1999 | Kuznicki |
| 5,945,012 A | 8/1999 | Chan |
| 5,963,801 A | 10/1999 | Aronowitz et al. |
| 5,985,742 A | 11/1999 | Henley et al. |
| 5,988,103 A | 11/1999 | Fetherston et al. ....... 118/723 E |
| 5,994,207 A | 11/1999 | Henley et al. |
| 5,998,282 A | 12/1999 | Lukaszek |
| 5,999,268 A | 12/1999 | Yonezawa et al. |
| 6,006,253 A | 12/1999 | Kumar et al. |
| 6,010,579 A | 1/2000 | Henley et al. |
| 6,013,563 A | 1/2000 | Henley et al. |
| 6,016,036 A | 1/2000 | Brailove |
| 6,033,974 A | 3/2000 | Henley et al. |
| 6,034,321 A | 3/2000 | Jenkins |
| 6,048,411 A | 4/2000 | Henley et al. |
| 6,051,073 A | 4/2000 | Chu et al. |
| 6,060,718 A | 5/2000 | Brailove et al. |
| 6,083,324 A | 7/2000 | Henley et al. |
| 6,084,175 A | 7/2000 | Perry et al. |
| 6,091,021 A | 7/2000 | Ruby et al. |
| 6,093,625 A | 7/2000 | Wagner et al. |
| 6,103,599 A | 8/2000 | Henley et al. |
| 6,113,735 A | 9/2000 | Chu et al. |
| 6,120,660 A | 9/2000 | Chu et al. |
| 6,130,380 A | 10/2000 | Nakamura |
| 6,138,606 A | 10/2000 | Ling |
| 6,146,979 A | 11/2000 | Henley et al. |
| 6,150,708 A | 11/2000 | Gardner et al. |
| 6,153,524 A | 11/2000 | Henley et al. |
| 6,155,909 A | 12/2000 | Henley et al. |
| 6,159,824 A | 12/2000 | Henley et al. |
| 6,159,825 A | 12/2000 | Henley et al. |
| 6,162,705 A | 12/2000 | Henley et al. |
| 6,171,965 B1 | 1/2001 | Kang et al. |
| 6,180,496 B1 | 1/2001 | Farrens et al. |
| 6,184,111 B1 | 2/2001 | Henley et al. |
| 6,186,091 B1 | 2/2001 | Chu et al. |
| 6,200,883 B1 | 3/2001 | Taylor et al. |
| 6,204,151 B1 | 3/2001 | Malik et al. |
| 6,207,005 B1 | 3/2001 | Henley et al. |
| 6,213,050 B1 | 4/2001 | Liu et al. |
| 6,217,724 B1 | 4/2001 | Chu et al. |
| 6,221,740 B1 | 4/2001 | Bryan et al. |
| 6,221,774 B1 | 4/2001 | Malik |
| 6,228,176 B1 | 5/2001 | Chu et al. |
| 6,245,161 B1 | 6/2001 | Henley et al. |
| 6,248,649 B1 | 6/2001 | Henley et al. |
| 6,263,941 B1 | 7/2001 | Bryan et al. |
| 6,265,328 B1 | 7/2001 | Henley et al. |
| 6,269,765 B1 | 8/2001 | Chu et al. |
| 6,271,566 B1 | 8/2001 | Tsuchiaki |
| 6,274,459 B1 | 8/2001 | Chan |
| 6,281,428 B1 | 8/2001 | Chiu et al. |
| 6,287,941 B1 | 9/2001 | Kang et al. |
| 6,290,804 B1 | 9/2001 | Henley et al. |
| 6,291,313 B1 | 9/2001 | Henley et al. |
| 6,291,314 B1 | 9/2001 | Henley et al. |
| 6,291,326 B1 | 9/2001 | Henley et al. |
| 6,294,434 B1 | 9/2001 | Tseng |
| 6,300,227 B1 | 10/2001 | Liu et al. |
| 6,321,134 B1 | 11/2001 | Henley et al. |
| 6,335,534 B1 | 1/2002 | Suguro et al. |
| 6,338,313 B1 | 1/2002 | Chan |
| 6,365,492 B1 | 4/2002 | Suguro et al. |
| 6,383,876 B1 | 5/2002 | Son et al. |

(56) References Cited

U.S. PATENT DOCUMENTS

| | | |
|---|---|---|
| 6,391,740 B1 | 5/2002 | Cheung et al. |
| 6,417,515 B1 | 7/2002 | Barrett et al. |
| 6,429,037 B1 | 8/2002 | Wenham et al. |
| 6,448,152 B1 | 9/2002 | Henley et al. |
| 6,458,723 B1 | 10/2002 | Henley et al. |
| 6,468,884 B2 | 10/2002 | Miyake et al. |
| 6,476,313 B2 | 11/2002 | Kawano |
| 6,486,478 B1 | 11/2002 | Libby et al. |
| 6,489,241 B1 | 12/2002 | Thilderkvist et al. |
| 6,495,010 B2 | 12/2002 | Sferlazzo |
| 6,500,732 B1 | 12/2002 | Henley et al. |
| 6,507,689 B2 | 1/2003 | Tirloni et al. |
| 6,534,381 B2 | 3/2003 | Cheung et al. |
| 6,544,862 B1 | 4/2003 | Bryan |
| 6,552,259 B1 | 4/2003 | Hosomi et al. |
| 6,552,414 B1 | 4/2003 | Horzel et al. |
| 6,594,579 B1 | 7/2003 | Lowrey et al. |
| 6,604,033 B1 | 8/2003 | Banet et al. |
| 6,611,740 B2 | 8/2003 | Lowrey et al. |
| 6,613,974 B2 | 9/2003 | Husher |
| 6,632,324 B2 | 10/2003 | Chan |
| 6,636,790 B1 | 10/2003 | Lightner et al. |
| 6,660,928 B1 | 12/2003 | Patton et al. |
| 6,732,031 B1 | 5/2004 | Lightner et al. |
| 6,780,759 B2 | 8/2004 | Farrens et al. |
| 6,787,693 B2 | 9/2004 | Lizotte |
| 6,874,515 B2 | 4/2005 | Ishihara et al. |
| 6,949,895 B2 | 9/2005 | DiVergilio et al. |
| 7,011,733 B2 | 3/2006 | Sandhu |
| 7,022,984 B1 | 4/2006 | Rathmell et al. |
| 7,066,703 B2 | 6/2006 | Johnson |
| 7,078,317 B2 | 7/2006 | Henley |
| 7,081,186 B2 | 7/2006 | Ehiasarian et al. |
| 7,094,666 B2 | 8/2006 | Henley et al. |
| 7,098,394 B2 | 8/2006 | Armer et al. |
| 7,147,709 B1 | 12/2006 | Ong et al. |
| 7,166,520 B1 | 1/2007 | Henley |
| 7,174,243 B1 | 2/2007 | Lightner et al. |
| 7,225,047 B2 | 5/2007 | Al-Bayati et al. |
| 7,225,065 B1 | 5/2007 | Hunt et al. |
| 7,228,211 B1 | 6/2007 | Lowrey et al. |
| 7,250,323 B2 | 7/2007 | Gadeken et al. |
| 7,339,110 B1 | 3/2008 | Mulligan et al. |
| 7,354,815 B2 | 4/2008 | Henley |
| 7,390,724 B2 | 6/2008 | Henley et al. |
| 7,399,680 B2 | 7/2008 | Henley |
| 7,427,554 B2 | 9/2008 | Henley et al. |
| 7,447,574 B1 | 11/2008 | Washicko et al. |
| 7,477,968 B1 | 1/2009 | Lowrey et al. |
| 7,479,441 B2 | 1/2009 | Kirk et al. |
| 7,480,551 B1 | 1/2009 | Lowrey et al. |
| 7,498,245 B2 | 3/2009 | Aspar et al. |
| 7,521,699 B2 | 4/2009 | Yamazaki et al. |
| 7,523,159 B1 | 4/2009 | Williams et al. |
| 7,532,962 B1 | 5/2009 | Lowrey et al. |
| 7,532,963 B1 | 5/2009 | Lowrey et al. |
| 7,547,609 B2 | 6/2009 | Henley |
| 7,598,153 B2 | 10/2009 | Henley et al. |
| 7,611,322 B2 | 11/2009 | Bluck et al. |
| 7,674,687 B2 | 3/2010 | Henley |
| 7,701,011 B2 | 4/2010 | Kamath et al. |
| 7,727,866 B2 | 6/2010 | Bateman et al. |
| 7,759,220 B2 | 7/2010 | Henley |
| 7,767,561 B2 | 8/2010 | Hanawa et al. |
| 7,772,088 B2 | 8/2010 | Henley et al. |
| 7,776,727 B2 | 8/2010 | Borden |
| 7,796,849 B2 | 9/2010 | Adibi et al. |
| 7,867,409 B2 | 1/2011 | Brcka |
| 2001/0002584 A1 | 6/2001 | Liu et al. |
| 2001/0017109 A1 | 8/2001 | Liu et al. |
| 2001/0020485 A1 | 9/2001 | Ford et al. |
| 2002/0090758 A1 | 7/2002 | Henley et al. |
| 2002/0109233 A1 | 8/2002 | Farrar |
| 2002/0109824 A1 | 8/2002 | Yamaguchi |
| 2002/0139666 A1 | 10/2002 | Hsueh et al. |
| 2002/0144725 A1 | 10/2002 | Jordan et al. |
| 2002/0185700 A1 | 12/2002 | Coffa et al. |
| 2003/0015700 A1 | 1/2003 | Eisenbeiser et al. |
| 2003/0106643 A1 | 6/2003 | Tabuchi et al. |
| 2003/0116090 A1 | 6/2003 | Chu et al. |
| 2003/0129045 A1 | 7/2003 | Bonora et al. |
| 2003/0137050 A1 | 7/2003 | Chambers et al. |
| 2003/0230986 A1 | 12/2003 | Horsky et al. |
| 2004/0025932 A1 | 2/2004 | Husher |
| 2004/0067644 A1 | 4/2004 | Malik et al. |
| 2004/0112426 A1 | 6/2004 | Hagino |
| 2004/0187916 A1 | 9/2004 | Hezel |
| 2004/0198028 A1 | 10/2004 | Tanaka et al. |
| 2004/0216993 A1 | 11/2004 | Sandhu |
| 2004/0232414 A1 | 11/2004 | Suthar et al. |
| 2005/0045835 A1 | 3/2005 | DiVergilio et al. |
| 2005/0150597 A1 | 7/2005 | Henley et al. |
| 2005/0181584 A1 | 8/2005 | Foad et al. |
| 2005/0247668 A1 | 11/2005 | Malik et al. |
| 2005/0266781 A1 | 12/2005 | Jaenen et al. |
| 2006/0019039 A1 | 1/2006 | Hanawa et al. |
| 2006/0037700 A1 | 2/2006 | Shi et al. |
| 2006/0148241 A1 | 7/2006 | Brody et al. |
| 2006/0157733 A1 | 7/2006 | Lucovsky et al. |
| 2006/0166394 A1 | 7/2006 | Kukulka et al. |
| 2006/0211219 A1 | 9/2006 | Henley et al. |
| 2006/0234484 A1 | 10/2006 | Lanzerotti et al. |
| 2006/0279970 A1 | 12/2006 | Kernahan |
| 2007/0012503 A1 | 1/2007 | Iida |
| 2007/0029043 A1 | 2/2007 | Henley |
| 2007/0032044 A1 | 2/2007 | Henley |
| 2007/0035847 A1 | 2/2007 | Li et al. |
| 2007/0068624 A1 | 3/2007 | Jeon et al. |
| 2007/0081138 A1 | 4/2007 | Kerkhof et al. |
| 2007/0084505 A1 | 4/2007 | Zaidi |
| 2007/0087574 A1 | 4/2007 | Gupta et al. |
| 2007/0119373 A1 | 5/2007 | Kumar et al. |
| 2007/0134840 A1 | 6/2007 | Gadeken et al. |
| 2007/0148336 A1 | 6/2007 | Bachrach et al. |
| 2007/0169806 A1 | 7/2007 | Fork et al. |
| 2007/0209707 A1 | 9/2007 | Weltman |
| 2007/0217020 A1 | 9/2007 | Li et al. |
| 2007/0235074 A1 | 10/2007 | Henley et al. |
| 2007/0277875 A1 | 12/2007 | Gadkaree et al. |
| 2007/0281172 A1 | 12/2007 | Couillard et al. |
| 2007/0290283 A1 | 12/2007 | Park et al. |
| 2008/0001139 A1 | 1/2008 | Augusto |
| 2008/0038908 A1 | 2/2008 | Henley |
| 2008/0044964 A1 | 2/2008 | Kamath et al. |
| 2008/0078444 A1 | 4/2008 | Atanackovic |
| 2008/0092944 A1 | 4/2008 | Rubin |
| 2008/0092947 A1 | 4/2008 | Lopatin et al. |
| 2008/0121275 A1 | 5/2008 | Ito et al. |
| 2008/0121276 A1 | 5/2008 | Lopatin et al. |
| 2008/0128019 A1 | 6/2008 | Lopatin et al. |
| 2008/0128641 A1 | 6/2008 | Henley et al. |
| 2008/0164819 A1 | 7/2008 | Hwang et al. |
| 2008/0179547 A1 | 7/2008 | Henley |
| 2008/0188011 A1 | 8/2008 | Henley |
| 2008/0190886 A1 | 8/2008 | Choi et al. |
| 2008/0206962 A1 | 8/2008 | Henley et al. |
| 2008/0242065 A1 | 10/2008 | Brcka |
| 2008/0275546 A1 | 11/2008 | Storey et al. |
| 2008/0296261 A1 | 12/2008 | Zhao et al. |
| 2009/0056807 A1 | 3/2009 | Chen et al. |
| 2009/0081860 A1 | 3/2009 | Zhou et al. |
| 2009/0124064 A1 | 5/2009 | England et al. ............... 438/486 |
| 2009/0124065 A1 | 5/2009 | England et al. ............... 438/486 |
| 2009/0140132 A1 | 6/2009 | Lee et al. |
| 2009/0142875 A1 | 6/2009 | Borden et al. |
| 2009/0152162 A1 | 6/2009 | Tian et al. |
| 2009/0162970 A1 | 6/2009 | Yang ............................. 438/96 |
| 2009/0206275 A1 | 8/2009 | Henley et al. |
| 2009/0227061 A1 | 9/2009 | Bateman et al. |
| 2009/0227062 A1 | 9/2009 | Sullivan et al. ............... 438/61 |
| 2009/0227094 A1 | 9/2009 | Bateman et al. |
| 2009/0227095 A1 | 9/2009 | Bateman et al. |
| 2009/0227097 A1 | 9/2009 | Bateman et al. |
| 2009/0246706 A1 | 10/2009 | Hendel et al. |

(56) References Cited

U.S. PATENT DOCUMENTS

| | | | |
|---|---|---|---|
| 2009/0289197 A1 | 11/2009 | Slocum et al. | |
| 2009/0308439 A1 | 12/2009 | Adibi et al. | |
| 2009/0308440 A1 | 12/2009 | Adibi et al. | |
| 2009/0309039 A1 | 12/2009 | Adibi et al. | |
| 2009/0317937 A1 | 12/2009 | Gupta et al. | 438/80 |
| 2010/0041176 A1 | 2/2010 | Sullivan et al. | 438/72 |
| 2010/0055874 A1 | 3/2010 | Henley | |
| 2010/0059362 A1 | 3/2010 | Anella | 204/192.11 |
| 2010/0110239 A1 | 5/2010 | Ramappa et al. | |
| 2010/0124799 A1 | 5/2010 | Blake et al. | |
| 2010/0167511 A1 | 7/2010 | Leung et al. | |
| 2010/0170440 A9 | 7/2010 | Mizukami et al. | |
| 2010/0178723 A1 | 7/2010 | Henley | |
| 2010/0180945 A1 | 7/2010 | Henley et al. | |
| 2010/0184243 A1 | 7/2010 | Low et al. | |
| 2010/0184248 A1 | 7/2010 | Hilali et al. | |
| 2010/0197125 A1 | 8/2010 | Low et al. | |
| 2010/0229928 A1 | 9/2010 | Zuniga et al. | |
| 2010/0240169 A1 | 9/2010 | Petti et al. | |
| 2010/0240183 A1 | 9/2010 | Narazaki | |
| 2010/0323508 A1 | 12/2010 | Adibi et al. | |
| 2011/0162703 A1 | 7/2011 | Adibi et al. | |
| 2011/0192993 A1 | 8/2011 | Chun et al. | |
| 2011/0309050 A1 | 12/2011 | Iori et al. | |
| 2012/0122273 A1 | 5/2012 | Chun et al. | |
| 2012/0125259 A1 | 5/2012 | Adibi et al. | |
| 2012/0129325 A1 | 5/2012 | Adibi et al. | |
| 2013/0115764 A1 | 5/2013 | Pederson et al. | |

FOREIGN PATENT DOCUMENTS

| | | |
|---|---|---|
| CN | 101055898 A | 10/2007 |
| CN | 101145569 A | 3/2008 |
| CN | 102099870 A | 6/2011 |
| CN | 102099923 A | 6/2011 |
| CN | 102150277 A | 8/2011 |
| CN | 102150278 A | 8/2011 |
| CN | 102396068 A | 3/2012 |
| CN | 102804329 A | 11/2012 |
| CN | 102834905 A | 12/2012 |
| DE | 4217428 A1 | 6/1993 |
| DE | 19820152 A1 | 11/1999 |
| EP | 2304803 A1 | 4/2011 |
| EP | 2308060 A1 | 4/2011 |
| EP | 2319087 A1 | 5/2011 |
| EP | 2319088 A1 | 5/2011 |
| EP | 2409331 A1 | 1/2012 |
| EP | 2489757 A2 | 8/2012 |
| EP | 2534674 A1 | 12/2012 |
| JP | 63-143876 A | 6/1988 |
| JP | 7-135329 A | 5/1995 |
| JP | 2011-524638 A | 9/2011 |
| JP | 2011-524639 A | 9/2011 |
| JP | 2011-524640 A | 9/2011 |
| JP | 2011-525301 A | 9/2011 |
| JP | 2012-521642 A | 9/2012 |
| JP | 2012-231520 A | 11/2012 |
| JP | 2012-531520 A | 12/2012 |
| KR | 100759084 B | 9/2007 |
| WO | WO2009/033134 A2 | 3/2009 |
| WO | WO2009/033134 A3 | 3/2009 |
| WO | WO2009/064867 A2 | 5/2009 |
| WO | WO2009/064867 A3 | 5/2009 |
| WO | WO2009/064872 A2 | 5/2009 |
| WO | WO2009/064872 A3 | 5/2009 |
| WO | WO2009/064875 A1 | 5/2009 |
| WO | WO2009/085948 A2 | 7/2009 |
| WO | WO2009/085948 A3 | 7/2009 |
| WO | WO2009/111665 A2 | 9/2009 |
| WO | WO2009/111665 A3 | 9/2009 |
| WO | WO2009/111666 A2 | 9/2009 |
| WO | WO2009/111666 A3 | 9/2009 |
| WO | WO2009/111667 A2 | 9/2009 |
| WO | WO2009/111667 A3 | 9/2009 |
| WO | WO2009/111668 A2 | 9/2009 |
| WO | WO2009/111668 A3 | 9/2009 |
| WO | WO2009/111668 A9 | 9/2009 |
| WO | WO2009/111669 A2 | 9/2009 |
| WO | WO2009/111669 A3 | 9/2009 |
| WO | 2009-155498 A2 | 12/2009 |
| WO | 2009152365 A1 | 12/2009 |
| WO | 2009152368 A1 | 12/2009 |
| WO | 2009152375 A1 | 12/2009 |
| WO | 2009152378 A1 | 12/2009 |
| WO | WO2009/155498 A2 | 12/2009 |
| WO | 2010-030645 A3 | 3/2010 |
| WO | WO2010/030645 A2 | 3/2010 |
| WO | 2010108151 A1 | 9/2010 |
| WO | 2011005582 A1 | 1/2011 |
| WO | 2011100363 A1 | 8/2011 |
| WO | 2012068417 A1 | 5/2012 |
| WO | 2013070978 A2 | 5/2013 |

OTHER PUBLICATIONS

In the Unites States Patent and Trademark Office, U.S. Appl. No. 61/095,010, filed Sep. 8, 2008, Entitled: "Use of Dopants With Different Diffusivities for Solar Cell Manufacture", First Named Inventor: Nicholas Bateman et al., Company: Varian Semiconductor Equipment Associates, Inc., Gloucester, Massachusetts.

"Varian Introduces a New High-Energy Ion Implant System for Optimized Performance and Lowest Cost of Ownership," Press Release, Business Wire, Jul. 14, 1999, 1 pg.

Walther, S.R. et al., "Using Multiple Implant Regions to Reduce Development Wafer Usage," Jan. 1, 2006, American Institute of Physics, CP866, Ion Implantation Technology, pp. 409-412.

Semiconductor Consulting Service publication: "Process Technology for the 21st Century,"Chapter 10-Substrates, Isolation, Well and Transistor Formation, Jan. 1999, downloaded from IC Knowledge. com, http://www.icknowledge.com/our_products/pt21c.html., pp. 10-1-10-4.

"Leading Semiconductor Manufacturer Selects Axcelis HE3 Ion Implantation Equipment; 300 mm Facility to Choose Axcelis Platform for High Energy Implant," Business Wire, Oct. 17, 2000, 1 pg.

Kondratenko, S. et al, "Channeling Effects and Quad Chain Implantation Process Optimization for Low Energy Boron Ions," abstract, IEEE Xplore Digital Library, Issue date: Sep. 22-27, 2002, Current version date: Jan. 7, 2004, 1 pg., downloaded from ieeexplore.ieee. org/xpl/freeabs_all.jsp?arnumber=1257941.

Nitodas, S.F., et al., "Advantages of single and mixed species chaining for high productivity in high and mid-energy implantation," published Sep. 2002, Ion Implantation Technology, Current version date Jan. 7, 2004, abstract, downloaded from ieeexplore.ieee.org., 1 pg.

Eaton Nova (Axcelis) 200E2 H/C Implanter, data sheet, 2 pgs. , Jan. 1990.

Anders, André, "Plasma and Ion Sources in Large Area Coating: A Review," Elsevier, www.sciencedirect.com, available Sep. 13, 2005, Surface and Coatings Technology 200 (2005) pp. 1893-1906.

Anders, "Plasma and Ion Sources in Large Area Coating: A Review", www.sciencedirect.com, Surface Coatings & Technology, Nov. 21, 2005, vol. 200, Issues: 5-6, pp. 1893-1906, Berkeley CA.

Cornet et al., "A New Algorithm for Charge Deposition for Multiple-Grid Method for PIC Simulations in r-z Cylindrical Coordinates", www.sciencedirect.com, Journal of Computational Physics, Jul. 1, 2007vol. 225, Issue: 1, pp. 808-828, Sydney, Australia.

Douglas et al., "A Study of the Factors Which Control the Efficiency of Ion-Implanted Silicon Solar Cells", IEEE Transactions on Electron Devices, vol. ED-27, No. 4, Apr. 1980, pp. 792-802.

Fu et al. "Enhancement of Implantation Energy Using a Conducting Grid in Plasma Immersion Ion Implantation of Dielectric/Polymeric Materials", Review of Scientific Instruments, vol. 74, No. 8, Aug. 2003, pp. 3697-3700.

Goeckner et al., "Plasma Doping for Shallow Junctions", Journal of Vacuum Science and Technology B, vol. 17, Issue: 5, Sep. 1999, pp. 2290-2293.

Jacques et al., "Plasma-Based Ion Implantation and Deposition: A Review of Physics, Technology, and Applications", http://www.

(56) References Cited

OTHER PUBLICATIONS escholarship.org/uc/itemM4k974r2, Lawrence Berkeley National Laboratory, May 16, 2005, pp. 1-69.
Kwok et al. "One-Step, Non-Contact Pattern Transfer by Direct-Current Plasma Immersion Ion Implantation", Journal of Physics D: Applied Physics, IOP Publishing, vol. 42, No. 19, Sep. 2009, pp. 1-6.
Kwok et al., "One-Step Non-Contact Pattern Transferring by Plasma Based Ion Implantation", Journal of Physics D: Applied Physics, IOP Publishing, vol. 41, No. 22, Oct. 2008, pp. 1-6.
Minnucci et al. "Tailored Emitter, Low-Resistivity, Ion-Implanted Silicon Solar Cells", IEEE Transactions on Electron Devices, vol. ED-27, No. 4, Apr. 1980, pp. 802-806.
Nielsen, "Ion Implanted Polycrystalline Silicon Solar Cells", Physica Scripta, vol. 24, No. 2, Aug. 1, 1981, pp. 390-391.
Sopian et al., "Plasma Implantation for Emitter and Localized Back Surface Field (BSF) Formation in Silicon Solar Cells", European Journal of Scientific Research, http://www.eurojournals.com/eisr.htm, ISSN 1450-216X, vol. 24, No. 3, Jan. 2008, pp. 365-372.
Tang et al., "Current Control for Magnetized Plasma in Direct-Current Plasma-Immersion Ion Implantation", American Institute of Physics, Applied Physics Letters, vol. 82, No. 13, Mar. 31, 2003, pp. 2014-2016.
Xu et al., "Etching of Nanopatterns in Silicon Using Nanopantography", Applied Physics Letters, vol. 92, Jan. 9, 2008, pp. 1-3.
Xu et al., "Nanopantography: A New Method for Massively Parallel Nanopatterning Over Large Areas", Nano Letters, vol. 5, No. 12, Jan. 2005, pp. 2563-2568.
Yankov et al., "Plasma Immersion Ion Implantation for Silicon Processing", Annalen der Physik, vol. 10, Issue: 4, Feb. 2001, pp. 279-298.
Young et al., "High-Efficiency Si Solar Cells by Beam Processing", Applied Physics Letters, vol. 43, Issue: 7, Oct. 1, 1983, pp. 666-668.
Zeng et al., "Steady-State, Direct-Current (DC) Plasma Immersion Ion Implantation (PIII) for Planar Samples", IEEE, Jan. 2000, pp. 515-519.
Zeng et al., "Steady-State Direct-Current Plasma Immersion Ion Implantation Using an Electron Cyclotron Resonance Plasma Source", Thin Solid Films, www.elsevier.com/locate/tsf, vol. 390, Issues: 1-2, Jun. 30, 2001, pp. 145-148.
Com-Nougue et al., "CW CO2 Laser Annealing Associated with Ion Implantation for Production of Silicon Solar Cell Junctions", Jan. 1982, IEEE, p. 770.
Armini et al., "Nuclear Instruments and Methods in Physics Research B6", Jan. 1985, vol. 94-99, 1 Page, North-Holland, Amsterdam, Spire Corporation, Patriots Park, Bedford, Masachusetts 01730, USA.
Jager-Hezel, "Developments for Large-Scale Production of High-Efficiency Silicon Solar Cells," Advances in Solid State Physics, vol. 34, Jan. 1994, pp. 97-113, <http://www.springerlink.com/content/982620t34312416v/>.
"Notification of Transmittal of the International Search Report and the Written Opinion of the International Searching Authority, or the Declaration," Date of mailing: Jul. 31, 2009, International Application No. PCT/US09/47090, International Filing Date: Jun. 11, 2009, pp. 1-10.
Donnelly et al., "Nanopantography: A Method for Parallel Writing of Etched and Deposited Nanopatterns", Oct. 2009, University of Houston, Houston, TX, 36 pages.
Examination Report in 048635-108068 dated Jul. 26, 2012 (Singapore Application No. 201009185-8).
"Notification of Transmittal of The International Search Report and The Written Opinion of The International Searching Authority, or The Declaration," Date of mailing: Apr. 6, 2011, International Application No. PCT/US11/24244, International Filing Date: Feb. 9, 2011, Authorized Officer: Blaine R. Copenheaver, pp. 1-9.
"Notification of Transmittal of The International Search Report and The Written Opinion of The International Searching Authority, or The Declaration," Date of mailing: May 25, 2010, International Application No. PCT/US10/28058, International Filing Date: Mar. 19, 2010, Authorized Officer: Lee W. Young, pp. 1-9.
"Notification of Transmittal of The International Search Report and The Written Opinion of The International Searching Authority, or The Declaration," Date of mailing: Oct. 7, 2010, International Application No. PCT/US10/039690, International Filing Date: Jun. 23, 2010, Authorized Officer: Blaine R. Copenheaver, pp. 1-12.
"Notification of Transmittal of The International Search Report and The Written Opinion of The International Searching Authority, or The Declaration," Date of mailing: Oct. 2, 2009, International Application No. PCT/US09/47094, International Filing Date: Jun. 11, 2009, Authorized Officer: Blaine R. Copenheaver, pp. 1-15.
"Notification of Transmittal of The International Search Report and The Written Opinion of The International Searching Authority, or The Declaration," Date of mailing: Aug. 4, 2009, International Application No. PCT/US09/47102, International Filing Date: Jun. 11, 2009, Authorized Officer: Lee W. Young, pp. 1-11.
"Notification of Transmittal of The International Search Report and The Written Opinion of The International Searching Authority, or The Declaration," Date of mailing: Jul. 29, 2009, International Application No. PCT/US09/47109, International Filing Date: Jun. 11, 2009, Authorized Officer: Lee W. Young, pp. 1-11.
"Notification of Transmittal of The International Search Report and The Written Opinion of The International Searching Authority, or The Declaration," Date of mailing: Mar. 29, 2012, International Application No. PCT/US11/61274, International Filing Date: Nov. 17, 2011, Authorized Officer: Lee W. Young, pp. 1-9.
Office Action (Non-Final) dated Mar. 15, 2012 (U.S. Appl. No. 12/821,053).
Office Action (Non-Final) dated Jun. 7, 2012 (U.S. Appl. No. 12/482,947).
Office Action (Final) dated Aug. 17, 2012 (U.S. Appl. No. 12/821,053).
Office Action (Non-Final) dated Aug. 24, 2012 (U.S. Appl. No. 12/482,980).
Office Action (Non-Final) dated Aug. 31, 2012 (Chinese Application No. 200980127945.7).
Office Action (Non-Final) dated Sep. 25, 2012 (U.S. Appl. No. 12/483,017).
Pelletier et al., "Plasma-Based Ion Implantation and Deposition: A Review of Physics, Technology, and Applications", http://www.escholarship.org/uchtem/84k974r2, Lawrence Berkeley National Laboratory, May 16, 2005, pp. 1-69.
Rentsch, et al. "Technology Route Towards Industrial Application of Rear Passivated Silicon Solar Cells", Conference Record of the 2006 IEEE 4th World Conference on Photovoltaic Energy Conversion. vol. 1 (2006) pp. 1008-1011.
Restriction Requirement dated Apr. 24, 2012 (U.S. Appl. No. 12/482,980).
Restriction Requirement dated Apr. 25, 2012 (U.S. Appl. No. 12/483,017).
Restriction Requirement in dated Oct. 5, 2012 (U.S. Appl. No. 12/728,105).
Vervisch et al., "Plasma Immersion Ion Implantation Applied to P+N. Junction Solar Cells", CP866, Ion, Implantation Technology, American Institute of Physics, vol. 866, Jan. 2006, pp. 253-256.
Written Opinion dated May 10, 2012, (Singapore Patent Application No. 201106457-3).
Younger et al, "Ion Implantation Processing for High Performance Concentrator Solar Cells and Cell Assemblies," Solar Cells, vol. 6, 1982, pp. 79-86.
"Implantation par Immersion Plasma (PULSION®)," Ion Beam Services (IBS), Zi Peynier Rousset, France, Dec. 2008.
Janssens et al., "Advanced Phosphorus Emitters for High Efficiency SI Solar Cells," 24th European Photovoltaic Solar Energy Conference, Hamburg, Germany Sep. 21-25, 2009.
Neuhaus et al., "Industrial Silicon Wafer Solar Cells," Hindawi Publishing Corporation, vol. 2007, pp. 1-15, Sep. 14, 2007.
Nikiforov et al., "Large vol. ICP Sources for Plasma-Based Accelerators," Korea Electrotechnology Research Institute (KERI), APAC 2004, Gyeongju, Korea.
Office Action (Non-Final) dated Dec. 5, 2012 (Chinese Application No. 200980128201.7).
Office Action (Non-Final) dated Jan. 14, 2013 (U.S. Appl. No. 12/728,105).

(56) References Cited

OTHER PUBLICATIONS

Office Action (Non-Final) dated Jan. 16, 2013 (U.S. Appl. No. 12/821,053).
Office Action (Non-Final) dated Jan. 28, 2013 (U.S. Appl. No. 12/482,685).
Steckl, "Particle-Beam Fabrication and in Situ Processing of Integrated Circuits," Proceedings of the IEEE, vol. 74, Issue 12.
Written Opinion dated Jun. 8, 2012, (Singapore Patent Application No. 201009191-6).
Written Opinion dated Jun. 8, 2012, (Singapore Patent Application No. 201009194-0).
Written Opinion dated Jan. 11, 2013, (Singapore Patent Application No. 201106457-3).
Xu, et al., Nanopantography results: continuous writing of etched Si 'nano-Ts' with $AR^+/Cl_2$.
Restriction Requirement in U.S. Appl. No. 13/299,292 dated Aug. 13, 2013.
International Search Report and Written Opinion in International Application No. PCT/US2012/64241, mailed on Mar. 26, 2013.
Japanese Office Action in Japanese Application No. 2011-513699, mailed on Jul. 23, 2013.
Chinese Office Action in Chinese Application No. 200980127944.2, mailed on Feb. 16, 2013.
Written Opinion in Singapore Application No. 201009193-2, mailed on Feb. 28, 2013.
Office Action in U.S. Appl. No. 12/482,980, mailed on Feb. 27, 2013.
Chinese Office Action in Chinese Application No. 200980127945.7, mailed on Jul. 25, 2013.
Japanese Office Action in Japanese Application No. 2011-513705, mailed on Jul. 16, 2013.
2nd Written Opinion in Singapore Patent Application No. 201009191-6 dated Jun. 14, 2013.
Office Action in U.S. Appl. No. 12/483,017, mailed on Apr. 23, 2013.
Chinese Office Action in Chinese Application No. 200980128202.1, mailed on May 8, 2013.
Japanese Office Action in Japanese Application No. 2011-513706, mailed on Jul. 30, 2013.
Examination Report in Singapore Application No. 201009194-0, dated Jun. 25, 2013.
Office Action in U.S. Appl. No. 12/728,105, mailed on May 21, 2013.
Office Action in U.S. Appl. No. 12/821,053, mailed on Aug. 13, 2013.
Written Opinion and Search Report in Singapore Patent Application No. 201107307-9, mailed on Apr. 22, 2013.
Office Action in U.S. Appl. No. 13/363,341, mailed on Apr. 5, 2013.
Restriction Requirement in U.S. Appl. No. 13/363,347, mailed on Jul. 9, 2013.
Restriction Requirement in U.S. Appl. No. 13/024,251, mailed on Jun. 19, 2013.

* cited by examiner

SOLAR CELL FABRICATION WITH FACETING AND ION IMPLANTATION

RELATED APPLICATIONS

This application claims priority under 35 U.S.C. §119(e) of the U.S. provisional patent applications, Ser. No. 61/131,687, filed Jun. 11, 2008, and titled "Solar Cell Fabrication Using Implantation"; Ser. No. 61/131,688, filed Jun. 11, 2008, and titled "Application Specific Implant System for Use in Solar Cell Fabrications"; Ser. No. 61/131,698, filed Jun. 11, 2008, and titled "Formation of Solar Cell Selective Emitter Using Implant and Anneal Method"; Ser. No. 61/133,028, filed Jun. 24, 2008, and titled, "Solar Cell Fabrication with Faceting and Implantation"; and Ser. No. 61/210,545, filed Mar. 20, 2009, and titled "Advanced High Efficiency Crystalline Solar Cell Fabrications Method," all of which are incorporated by reference in their entireties.

FIELD OF THE INVENTION

This invention relates to semiconductor devices and methods of fabricating them. More specifically, this invention relates to methods of fabricating solar cells with reduced ohmic losses.

BACKGROUND OF THE INVENTION

Semiconductor solar cells are well known for transforming light into electric current. The efficiency of solar cells is limited in part by ohmic losses, which are affected by the dopant diffusion and contact screen printing used to fabricate the solar cells.

FIG. 1 shows a prior art solar cell 100. The solar cell 100 converts light striking photo-receptive regions 135 on its top surface into electric current, which can be transmitted to a load 150. The solar cell 100 includes an n-type emitter layer 115 overlying a p-type substrate 110, thereby defining a p-n junction 111. The emitter layer 115 contains highly doped n-wells 117 that form gridlines and can be covered with an anti-reflective coating (ARC) 120. Metallic fingers 125 are formed on top of the n-wells 117 to couple the n-wells to a busbar 130. The busbar 130 is coupled to the load 150, which in turn is coupled to a metallic contact 140 on a backside of the substrate 110.

The emitter layer 115 is formed by exposing the substrate 110 to a source of n-type ions, which then diffuse into a top surface of the base 100. The doping profile of the solar cell 100 has several drawbacks.

First, producing this profile results in excess un-activated dopants near the top surface, as the dopants are driven into the bulk of the substrate 100. This effect leads to varying levels of light absorption, the creation of electron-hole pairs, and unwanted recombination of electron-hole pairs. This is known as "dead layer," in which blue light is not absorbed close to the top surface of the photo-receptive regions 135. Because of the high doping level near the surface, electron-hole pairs created in the dead layer quickly recombine before they can generate any current flow. Facetting, used to reduce the amount of light reflected from the solar cell before it can generate current.

Second, diffusion techniques used to form a conventional profile are not optimal for the formation of selective doping regions with a homogenous high resistivity photo-receptive region and low-resistance regions for gridlines, contact fingers, busbars, metal-silicon interfaces, and backside metallization.

Third, direct overlay of metal on the semiconductor can result in different work functions at the interface between the conductive fingers 125 and the emitter layer 115. To better match the work functions between a metal contact and the doped silicon, some prior art techniques melt the contacts 125 to form a silicide at the interface. While forming a silicide may help tailor the work functions, there are still undesirable ohmic losses and the potential of metal shunting.

Finally, lateral positioning of dopants across a substrate is becoming difficult as the line widths and wafer thicknesses are decreasing. Geometries in solar cell gridlines are expected to drop from about 200 microns to 50 microns, and later to drop even smaller. Present screen-printing techniques are ill equipped to fabricate devices with such small displacements. Moreover, as wafers are getting ever thinner, vertical and batch diffusion and screen printing become extremely difficult.

SUMMARY OF THE INVENTION

In accordance with embodiments, solar cells are fabricated by precisely placing dopants both laterally, across layers of the underlying substrate, as well as into the bulk of the substrate. Ion beams are directed to create heavily doped areas that form gridlines, as well as lightly doped areas between the gridlines. By tailoring parameters, an atomic dopant profile is simultaneously matched to provide electrical junctions at appropriate depths using predetermined substrate doping levels and to provide the resistivity required for the formation of contacts at the substrate surface. Such independent control is unique to implantation methods.

In a first aspect, a semiconductor device includes a substrate having a surface that contains textured regions doped with a dopant to a first doping level and non-textured regions forming gridlines and doped with the dopant to a second doping level larger than the first doping level. The substrate is p-type or n-type; the dopant is of the opposite type. The semiconductor device includes conductive fingers coupled to the gridlines and a bottom portion that is coupled to a metallic contact containing impurities. The textured-regions are photo-receptive regions.

Preferably, each of the textured regions includes multiple textured elements, such as pyramidal elements having <111> planes, dome-shaped elements, or any other undulating (rising and falling) structures that reduce the amount of light reflected from the photo-receptive regions.

The dopant in each of the multiple textured elements has either a uniform thickness or a thickness that varies along the faces of the elements.

In one embodiment, each of the textured regions is covered with an anti-reflective coating. The dopants in the non-textured regions are interspersed with a metallic species.

In a second aspect, a method of fabricating a solar cell includes directing a uniform ion beam onto a surface of a substrate having non-textured and textured regions. Dopants are implanted into the textured regions at a first density and into the non-textured regions at a second density larger than the first density to form gridlines. The gridlines are coupled to contact fingers.

In one embodiment, the textured regions include multiple individual textured elements, such as pyramidal elements. Alternatively, the multiple textured elements are semi-spherical. The beam can be shaped to implant dopants into each of the textured elements individually or into a group of textured elements simultaneously.

Either the beam, the substrate, or both is rotated so that the beam is substantially perpendicular to faces of each of the multiple textured elements. The beam can also be scanned across the surface to thereby implant the dopants into the textured and non-textured regions.

In one embodiment, a cloud of ion plasma is used to conformally dope the whole of the substrate and any textured features on the surface.

In one embodiment, a resistance of the dopant in the non-textured regions is about 20 ohms per square, and a resistance of the dopant in the textured regions is less than about 100 ohms per square. A junction between the dopant in the textured region and the textured region is graded, a junction between the dopant in the non-textured region and the non-textured region is graded, or both.

The method also includes forming a silicide between the gridlines and the contact fingers and coupling the contact fingers to a busbar.

In a third aspect, a method of fabricating a solar cell includes etching a top surface of a substrate to form textured photo-receptive regions among planar regions. The textured regions include pyramidal shaped elements. The method also includes directing an ion beam onto the top surface, thereby implanting dopants into the textured regions at a first density and into the planar regions at a second density larger than the first density to form gridlines. A resistance of the dopant in the textured regions is less than 100 ohms per square, and a resistance of the dopant in the planar regions is about 20 ohms per square. The method also includes coupling contact fingers to the gridlines.

In a fourth aspect, a solar cell includes a substrate having a top layer and a bottom layer. The top layer has a surface containing pyramidal regions doped with a dopant to a first doping level and substantially planar regions forming gridlines and doped with the dopant to a second doping level larger than the first doping level. Adjacent ones of the planar regions are less than 50 microns apart. The gridlines are coupled to metallic fingers by silicide elements, and a metal contact is coupled to the bottom layer.

In a fifth aspect, a system for fabricating solar cells includes a source for producing ions, a beam shaper, and a controller. The beam shaper directs a beam containing the ions onto a substrate. The controller directs the beam shaper so that a textured photo-receptive region of the substrate is implanted with the ions to a first density and a planar region of the substrate defining a gridline is implanted with the ions to a second density larger than the first density.

The controller directs the beam shaper to step the beam to individually implant textured elements in the photo-receptive region. The controller also rotates, tilts, or translates the substrate, or any combination of these motions, when the beam is directed onto the substrate.

The controller directs the beam shaper and a duration of the implants so that a resistance of the photo-receptive region is less than 100 ohms per square and a resistance of the planar region is less than 20 ohms per square.

DETAILED DESCRIPTION OF THE INVENTION

Embodiments of the present invention are directed to methods of fabricating a solar cell by heavily doping its selective emitter region and more lightly doping its photo-receptive regions. In some embodiments, the selective emitter region and the photo-receptive regions are formed in the same processing step.

For the best performance of a solar cell, the photo-receptive regions are lightly doped to provide a homogeneous high sheet resistance. A more heavily doped region increases the chance of electron-hole recombination and thus decreases the efficiency of converting photons into electrical power. In accordance with embodiments, the n-doped layer of the photo-receptive regions of the solar cell is lightly doped to provide a sheet resistance of between 80 and 160 ohms per square, preferably 100 ohms per square, or an ion doping of around $1E+19$ $cm^{-3}$. Preferably, the gridlines, over which the conductive finger contacts are formed, are more heavily doped to couple the generated charge to the finger contacts. To provide the desired resistance, the selective emitter regions are doped to a sheet resistance of 10-40 ohms per square, preferably 25 ohms per square, or an ion doping of around $1E+20$ $cm^{-3}$. Preferably, the back surface of the solar cell is doped with a p-type layer to have a resistance between 30 and 70 ohms per square.

Some of the embodiments use shaped and parallel beams to implant dopants, allowing the implantation process to be completed more quickly and with a higher productivity. These beams help reduce the amount of unwanted dopants in the fabricated device.

Figure 1:
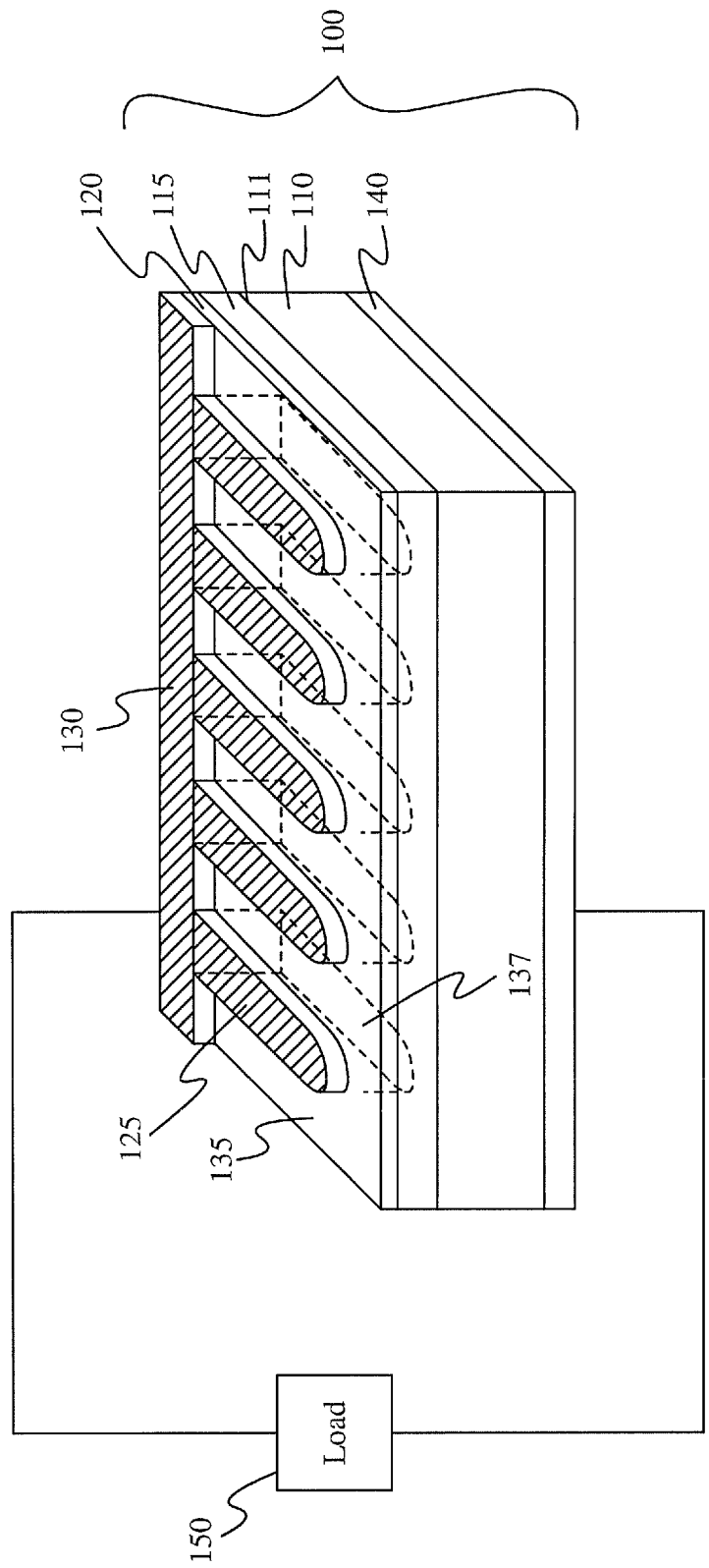
FIG. 1 shows a prior art solar cell coupled to a load.
Figure 2:
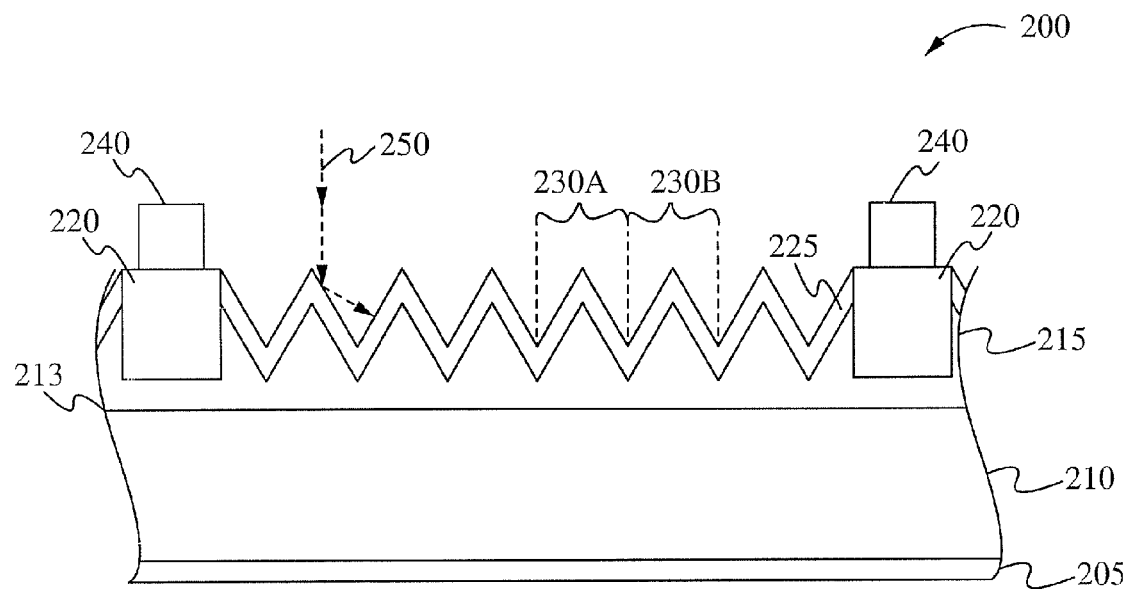
FIG. 2 is a side cross-sectional view of a portion of a solar cell in accordance with one embodiment.

FIG. 2 shows a portion of a solar cell 200 in accordance with one embodiment, with a light beam 250 impinging on a photo-receptive region 225. As with all the figures, the same label refers to the same element throughout. The solar cell 200 contains a p-type substrate 210 sandwiched between a bottom metal contact 205 and an n-type emitter layer 215. The substrate 210 can be mono-crystalline or multi-crystalline silicon, thin-film deposited silicon, or any other materials used to fabricate solar cells and other semiconductor devices.

The interface between the p-type substrate 210 and the n-type emitter layer 215 forms a p-n junction 213. The photo-receptive region 225 contains one or more faceted regions. By directing light that would normally be reflected away from the solar cell 200 back onto the solar cell 200, the faceted region 225 decreases the amount of light lost by reflection, thereby increasing the efficiency of the solar cell 200. In one embodiment, the faceted region 225 is also covered by an anti-reflective coating.

The solar cell 200 also contains n-doped regions 220 (gridlines) having a substantially planar top surface coupled to metallic contact fingers 240.

Generally, solar cells contain more faceted regions and selective emitters than that shown in FIG. 2. FIG. 2 shows only one faceted region (containing facets 230A and 230B) and only one emitter region merely to simplify the drawing.

In the embodiment of FIG. 2, the facets 230A and 230B are individual four-sided pyramidal elements, having exposed <111> planes.

Figure 3:
FIG. 3 is a top view of a pyramidal facet of the solar cell of FIG. 2.
Figure 3:
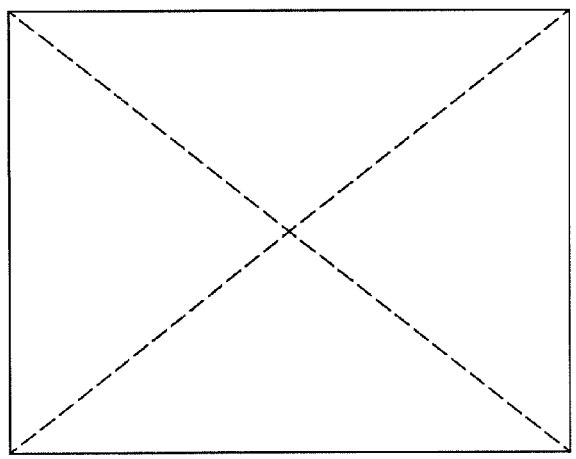

FIG. 3 is a top level view of the pyramidal facet 230A. Preferably, the height of the facet 230A is less that 10 microns, with a base having a comparable width. Those skilled in the art will recognize that the exemplary facet 230A can have other dimensions, as well as other shapes that reflect light back onto the surface of the solar cell 200. As one other example, the facet 230A is dome shaped.

Figure 4:
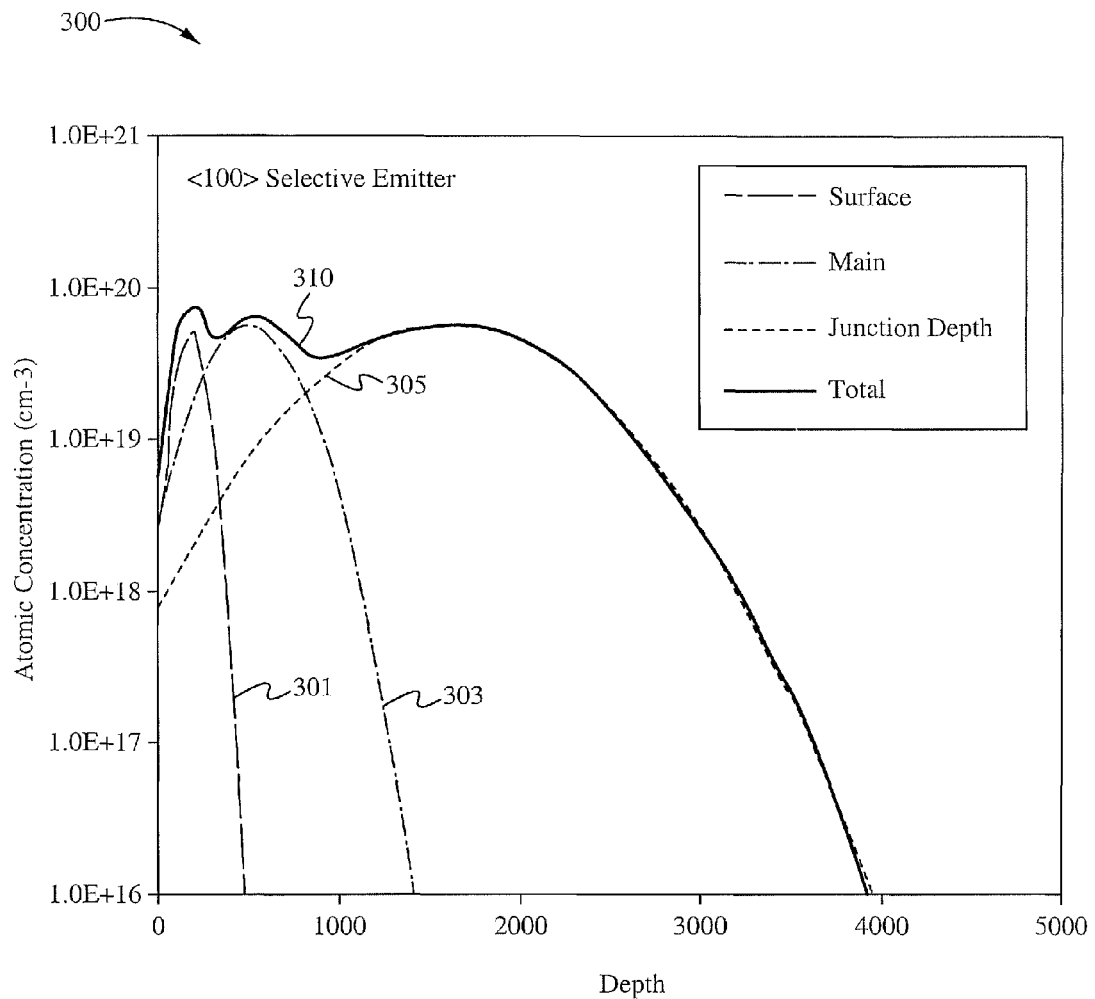
FIG. 4 is a graph of doping concentration versus depth for the planar region of the solar cell of FIG. 2.

FIG. 4 shows a graph 300 that plots atomic concentration versus depth from a top surface (in angstroms) of the cell 200 for the planar regions 220. The graph 300 shows concentrations for a first implant stage 301 closest to the top surface, a second (main) implant stage 302, a third implant stage 303 closest to the PN junction 213, and the total concentration 310.

Figure 5:
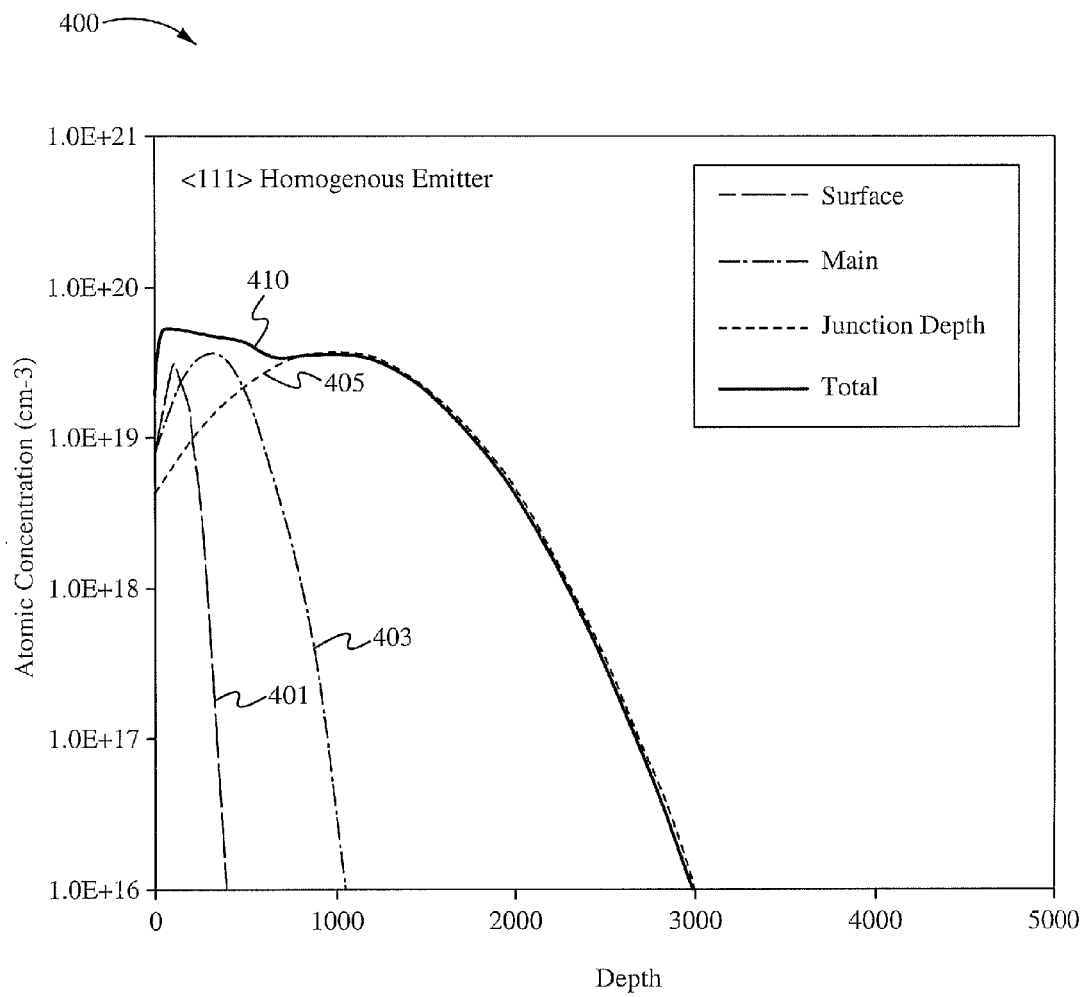
FIG. 5 is a graph of doping concentration versus depth for the non-planar (textured) region of the solar cell of FIG. 2.

FIG. 5 shows a graph 400 that plots atomic concentration versus depth from a top surface of the cell 200 (in angstroms) along the non-planar, textured (e.g., having an exposed <111> surface) regions 225. The graph 400 shows concentrations for a first implant stage 401 closest to the top surface, a second (main) implant stage 403, a third implant stage 405 closest to the p-n junction 213, and total concentration 410. This doping profile reduces the "dead layer" effect.

Such simultaneous implantation of <111> and <100> crystalline-plane silicon leads to a unique atomic profile. The surface area is presented to the implant beam, that is, directed to the <100> plane. Due to the geometry changes, the dosage implanted into the <111> plane is 0.578 of the dosage simultaneously implanted into the <100> plane. Additionally, the angle of incidence changes for differently oriented planes, and thus the penetration of ions will vary as a cosine function. For example, for a 120 keV beam, the projected range can vary from 1610 angstroms from the surface of the <100> plane to 998 angstroms from the surface of the <111> plane.

Figure 6A:
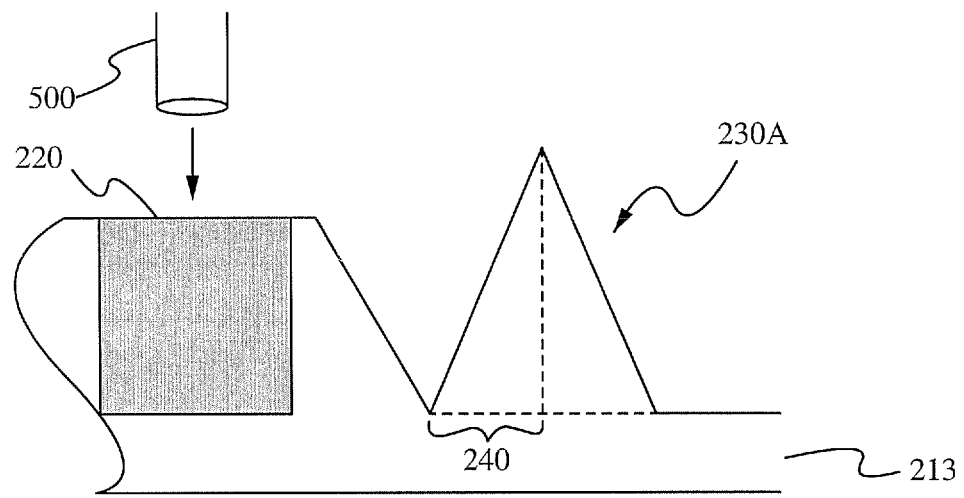
FIGS. 6A and B show sequentially implanting ions in an emitter region and facet regions of a solar cell in accordance with one embodiment.
Figure 6B:
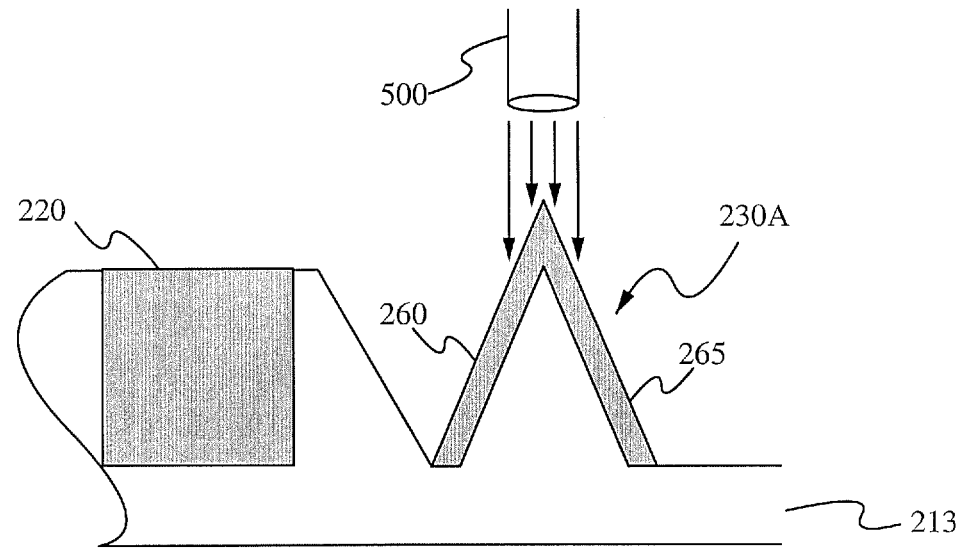

FIGS. 6A and B show doping the regions 220 and 230A of FIG. 2 using an ion beam source 500, during sequential steps. FIG. 6A shows the ion beam source 500 first positioned above a surface of the substrate 200, implanting n-type dopants in the substantially planar region 220. Next, as shown in FIG. 6B, the source 500 is positioned so as to implant n-type dopants into right-hand and left-hand portions of the facet 230A. Both the left- and right-hand portions of the facet 230A are doped to a predetermined density and profile. Advantageously, processing these left- and right-hand portions does not require precise alignment of the source 500 with a wafer geometry or the use of a narrowly focused ion beam.

Such a change in the angle of implant and thus the implanted area can be used to advantage. As the implant angle deviates from the normal incidence, the lateral depth of the dopant is reduced. Similarly, the beam is spread over a larger area, as a cosine of the angle. Thus, the dopant dose is reduced. Such variation can be used to produce regions of high doping concentrations and deeper junctions versus regions of lower doping concentrations and shallower junctions.

The added surface area provided by the facet 230A has other advantages. As one example, during ion implantation the added surface area spreads the heat generated by the source 500, allowing for the use of higher density beams that increase productivity.

As shown in FIG. 6A, the left portion has a base labeled 240. In one embodiment, a diameter of the beam is much larger than the base 240, allowing a single beam to dope both the left and right portions simultaneously. In other embodiments, the diameter of the beam is large enough to implant multiple facets simultaneously. Those skilled in the art will recognize that other beam diameters can be used. Furthermore, a whole encompassing plasma beam can be used, such as to conformally dope the textured features on the surface.

In one embodiment, the source 500 emits a beam with the same density (e.g., ions per second) when the source 500 is positioned over the regions 220 and 230A. Because the region 230A is angled to the source, it provides a larger surface area for the beam, resulting in the same charge being deposited over a larger area in the region 230A than in the region 220. Accordingly, the region 220 is more highly doped than the region 230A.

In one embodiment, the exemplary facet 230A is formed of a silicon substrate etched along the <111> plane, resulting in facet faces that have an angle of 54.7° to the substrate surface.

FIGS. 6A-C show the beam source 500 non-perpendicular to the sloping (angled) face of the facet 230A. In this arrangement, the doping thickness along the facet 230A increases from the base of the facet 230A to its apex.

Figure 7:
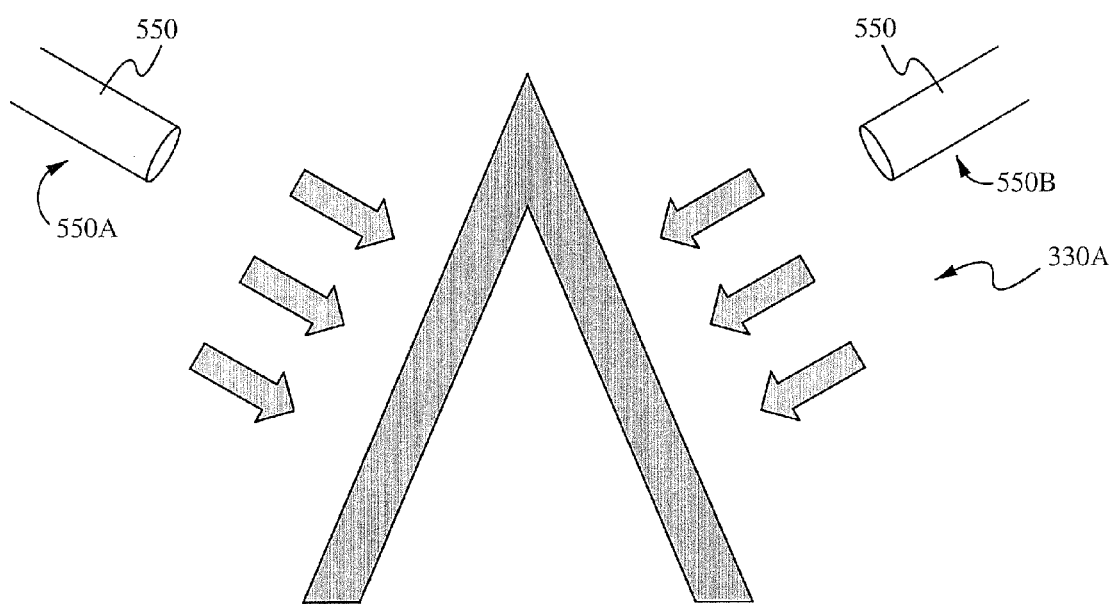
FIG. 7 shows a pyramidal facet of a solar cell, having a uniform doping concentration in accordance with one embodiment.

FIG. 7 shows an arrangement in which a beam source 550 is positioned perpendicular to the sloping faces of the facet 230A. In the first position (labeled 550A), the source 550 is perpendicular to the left face of the facet 230A. In the second position (labeled 550B), the beam source is perpendicular to the right face of the facet 230A.

In one embodiment, a single beam source is sequentially positioned in the first and second positions (550A and 550B); in another embodiment, separate beam sources are simultaneously positioned in the first and second positions so that the left- and right-portions are doped concurrently.

Figure 8A:
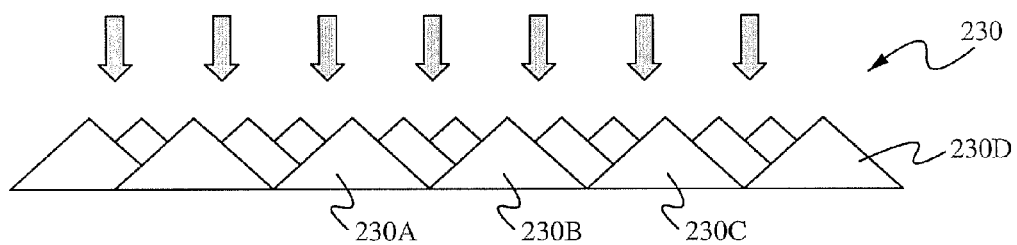
FIGS. 8A-C show implanting ions into faceted regions of a solar cell in accordance with different embodiments.
Figure 8B:
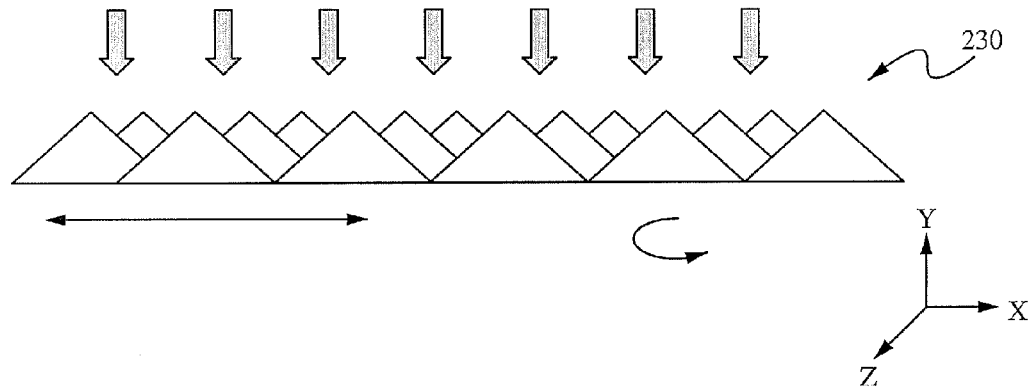
Figure 8C:
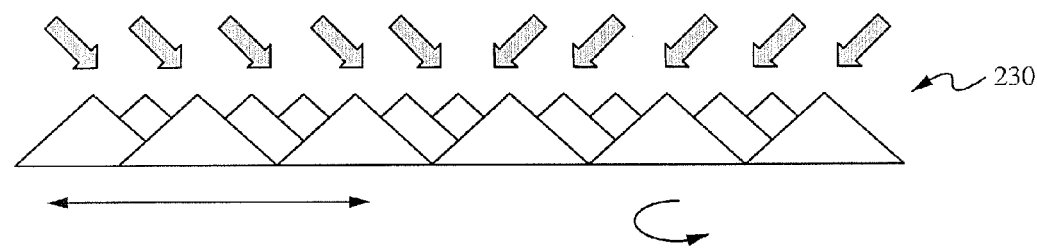

In accordance with embodiments, the substrate 200 and one or more ion beam sources are moved relative to each other in different ways to dope the substantially planar region 220 and the faceted region 230, which includes the individual facets 230A and 230B. To simplify the drawings, FIGS. 8A-C show only a single faceted region 230. As one example, FIG. 8A shows ions from the one or more ion beam sources aimed perpendicular to the top surface of the substrate 200.

In one embodiment, the facets 230A and 230B are individually doped by scanning an ion beam separately across each of them. Alternatively, separate parallel ion beams concurrently dope the individual facets 230A and 230B. In this way, the doping level of each facet or group of facets can be individually controlled, allowing a more precise and tailored doping profile of the solar cell 200.

As shown by the vertical and circular lines under FIG. 8B, the substrate 200 can be translated vertically (along the x-axis), rotated (along the y-axis), tilted, or any combination of these motions, relative to the one or more ion beam sources, so that the entire surface of the substrate 200 is implanted with dopants. In the example shown in FIG. 8C, the one or more ion beam sources are directed so that the ions are directed substantially perpendicular to the faces of the pyramidal facets. Again, the substrate 200 can be translated vertically, rotated, tilted, or any combination of these motions, relative to the one or more ion beam sources to implant the entire surface of the substrate 200 with dopants. Indeed, the ion beam can be an engulfing plasma of ions that conformally dope these textured features. This is particularly advantageous for multigrade silicon, where the faceting on the surface has no unique geometry and furthermore can have pin holes and re-entrant hillock features that may be observed by a line-of-sight dopant system. Such conformal doping will provide consistent doping independent of any surface features.

In still other embodiments, the ion beam is directed onto the substrate 200 so that it impinges at angles other than perpendicular to the planar region or perpendicular to the faces of the facets 230A and 230B. These other angles can be determined based on the desired doping profile to fit the particular application at hand. In one embodiment, the angle is no more than 20 degrees off perpendicular to a top of the substrate surface.

FIGS. 9A-F are side cross-sectional views of a portion of a semiconductor device 600, during the steps for fabricating a solar cell in accordance with one embodiment. Generally, a solar cell contains many portions similar to that shown in FIGS. 9A-F. The portion of FIGS. 9A-F and no others is shown merely to simplify the drawings.

Figure 9A:
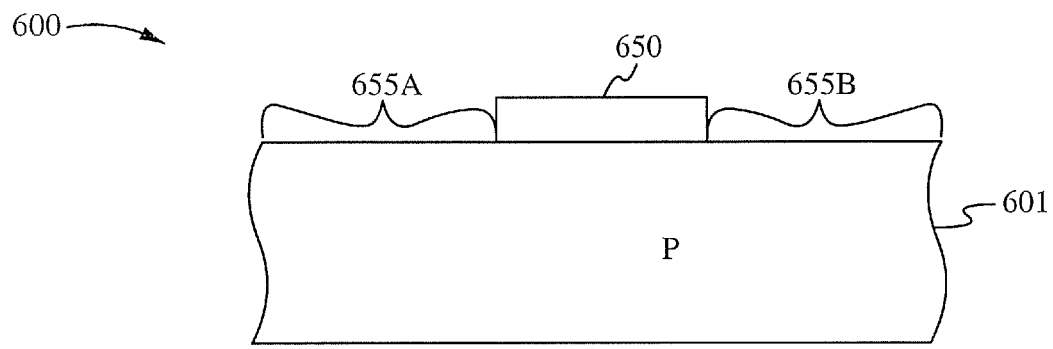
FIGS. 9A-F show a solar cell during sequential fabrication steps for forming pyramidal facets in accordance with one embodiment.

As shown in FIG. 9A, a p-type substrate 601 is masked with a photoresist material 650, leaving the regions 655A and 655B exposed. The photoresist material 650 is patterned using photolithographic or standard contact printing or inkjet printing techniques known to those skilled in the art. The region below the material 650, where the gridlines are to be formed, is about 50 to 100 microns wide. Accordingly, the large geometries provide for the use of photolithography techniques of lower precision relative to techniques required for semiconductors with sub-micron geometries.

Figure 9B:
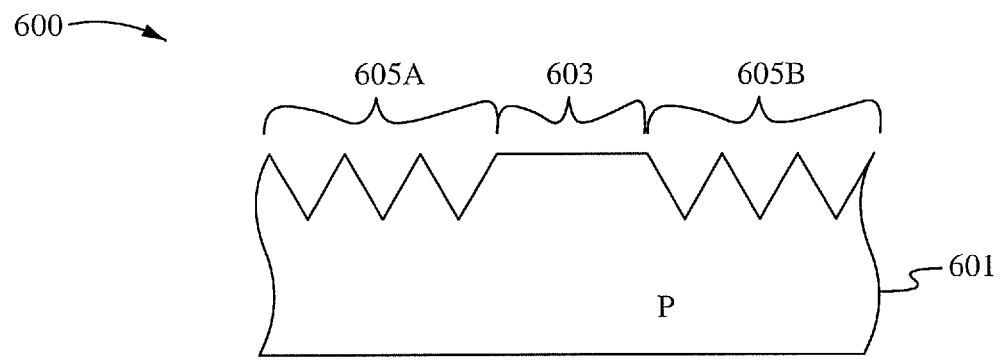

Next, as shown in FIG. 9B, the top layer of the device 600 is etched to form the faceted region, and the sacrificial material 650 is removed to expose the substantially planar surface 603. Preferably, the etching uses an acidic or alkaline etch, such as potassium hydroxide (KOH), to expose the <111> planes (textured regions) of the substrate 601, which contains the pyramidal facet regions 605A and 605B. Those skilled in the art will recognize that the regions 605A and 605B can be formed using other techniques, including optical, mechanical, and chemical techniques. Those skilled in the art will also recognize that the regions 605A and 605B can be formed into shapes other than pyramids, such as half domes, undulating waves, and other textured shapes.

Figure 9C:
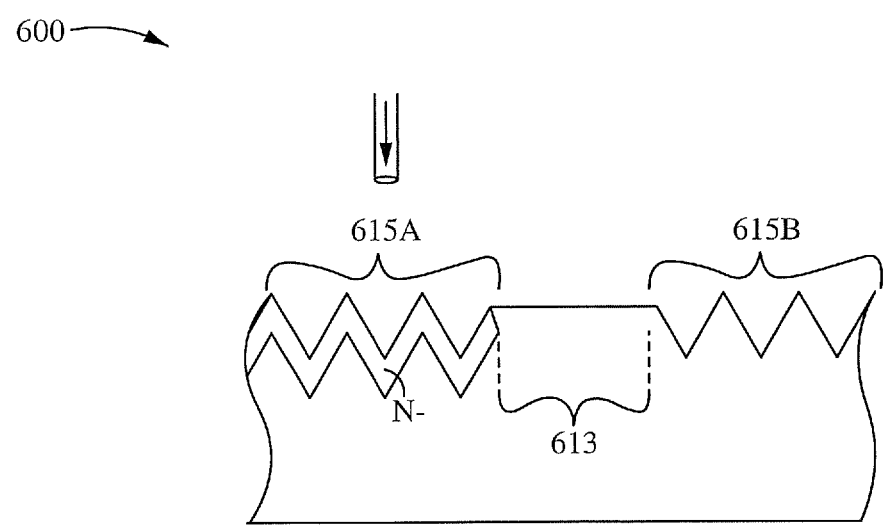
Figure 9D:
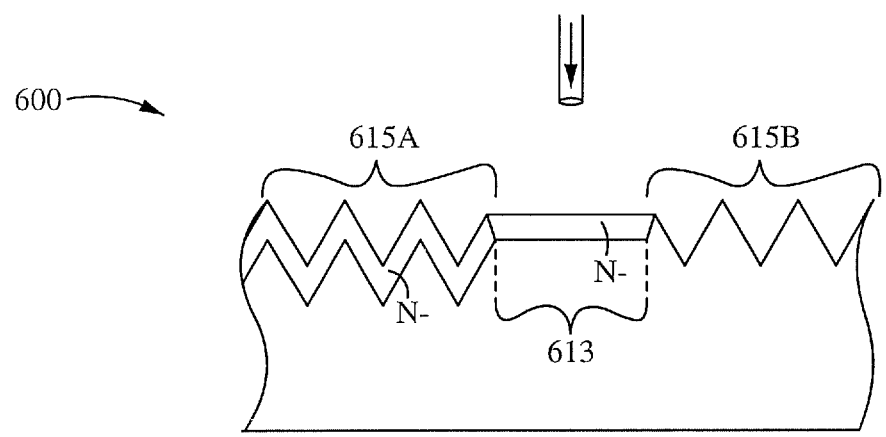
Figure 9E:
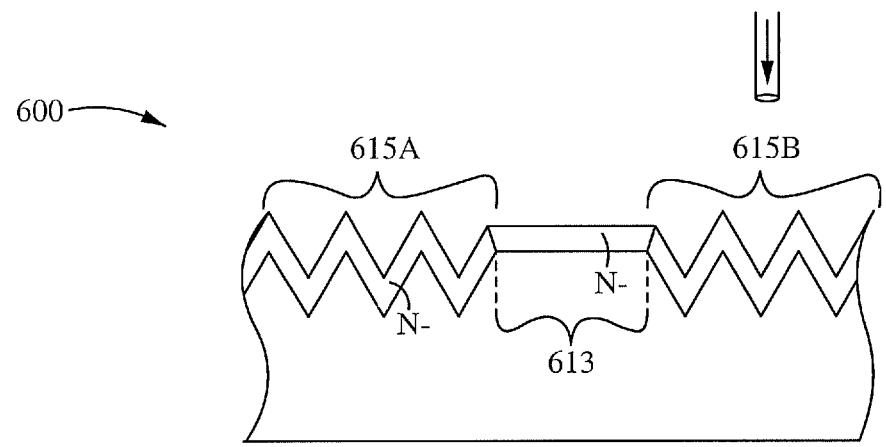

Next, as shown in FIGS. 9C-E, the regions 605A, 603, and 605B are all implanted, respectively, using a uniform beam of n-type dopants, directed substantially perpendicular to the surface 603, thereby forming the regions 615A, 613, and 615B, respectively. As explained above with respect to FIGS. 6A-C, because the regions 615A and 615B have angled surfaces and the region 613 does not, the density of the n-type dopants per cubic centimeter is larger in the region 613 than in the regions 615A and 615B. Accordingly, the sheet resistance of the regions 615A and 615B is larger than that of the region 613. The region 613 is also referred to as the selective emitter region.

Figure 9F:
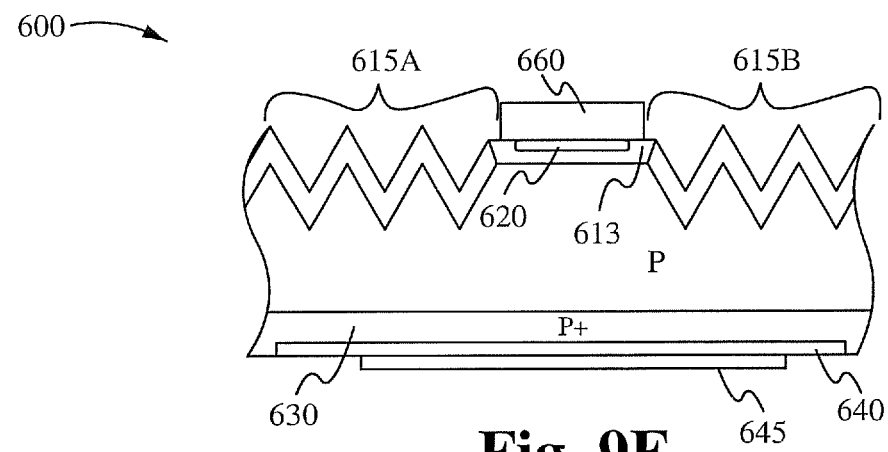

FIG. 9F shows the device 600 after later processing steps. During these steps (not shown), a thin layer of metal ions 620 is implanted into the top surface of the region 613, which is then topped with a metallic conductive finger 660. The metal ions 610 help to better match the work function between the finger 660 and the selective emitter 613. Examples of metal ions 610 include, but are not limited to, tantalum, aluminum, copper, or any combination of these. Preferably, the device 600 contains multiple fingers 660, all coupled by a busbar (not shown). In one embodiment, the fingers 660 are 50-100 microns wide and spaced apart by about 2-3 millimeters. Those skilled in the art will recognize that other widths and spacings are also possible.

Next, also as one of these later processing steps, p-type ions are implanted into the bottom of the substrate 601, forming the P+ region 630, thereby improving the conductivity of subsequently formed layers. Additional metal ions are then implanted into the P+ region 630 forming a metal silicon region 640, attached to a metal back side contact 645. The region 640 reduces the work function between the P+ silicon 630 and the contact 645.

Those skilled in the art will recognize that the process steps described in FIGS. 9A-F, as with all the process steps described in this Specification, are merely illustrative. Some of the steps can be deleted, other steps can be substituted, and the steps can be performed in different orders. As one example, the entire surface of the device 600 is faceted. A laser beam is then used to form the substantially planar region in which the selective emitter (603) is to be formed. The laser beam melts the facets in the selective emitter region, thereby melting the peaks of the facets and filling in the valleys between the peaks. The doping and other steps discussed with respect to FIGS. 9C-E are then performed.

Those skilled in the art will recognize many other ways to fabricate solar cells and other semiconductor devices in accordance with the embodiments. As one example, dopants are placed by implanting or depositing doped paste and then rapidly annealing the substrate, such as using a flash lamp or laser annealing to provide gridline doped layers.

Figure 10:
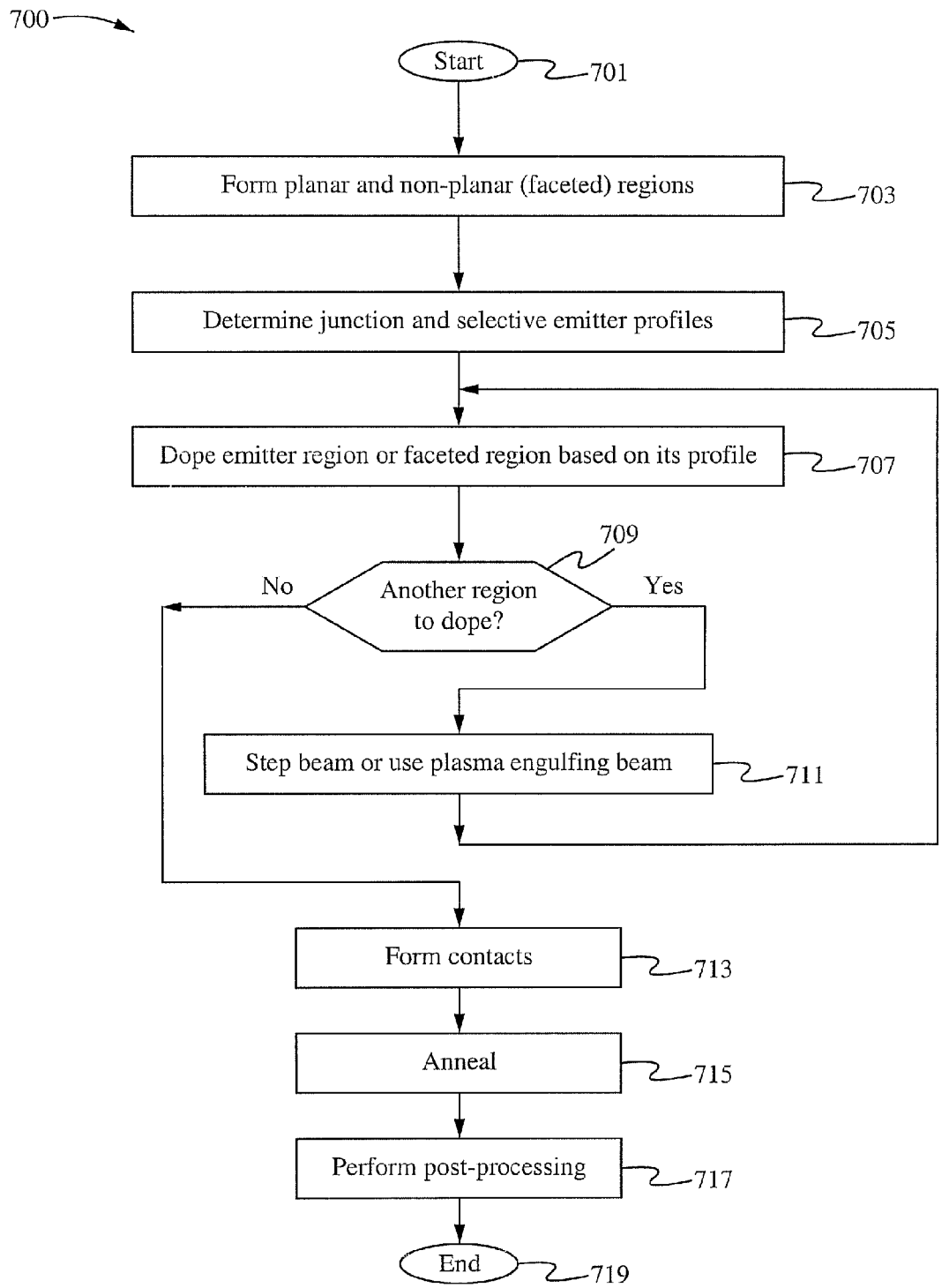
FIG. 10 is a flow chart of steps for fabricating a solar cell in accordance with one embodiment.

FIG. 10 shows the steps of a process 700 for fabricating a solar cell in accordance with one embodiment. The process 700 starts in the step 701. In the step 703, the planar region (e.g., element 613 in FIG. 9C) and the non-planar regions (e.g., elements 615A and 615B in FIG. 9C) are formed on a semiconductor substrate. Next, in the step 705, the doping profiles (e.g., doping levels based on depth, such as shown in FIG. 5) are determined, based on the desired solar cell characteristics. Next, in the step 707, a next element (e.g., an emitter region, faceted region, or individual facet) is doped using an ion beam. In the step 709, the process determines whether there is another element (e.g., a next facet) to be doped. If there is another element, the ion beam is moved in step 711, and the process loops back to the step 707. In an alternative embodiment, in which a plasma is used, rather than stepping an ion beam in the step 711, a plasma engulfing beam is used to engulf the entire surface of the substrate. Otherwise, the process continues to the step 713.

A substrate can be implanted in any number of stages to fit the desired doping profile. As one example, implanting is performed in three stages, such as illustrated by the multiple doping profiles in FIG. 5.

In the step 713, contacts (e.g., fingers, busbars, and any backside contacts) are formed, followed by the step 715, in which the substrate is annealed. Annealing the substrate-heating it to a temperature below melting-restores the crystal structure damaged by ion implantation. Next, in the step 717, any post-processing steps are performed. These post-processing steps include cleaning, removing any contaminants from, and adding any protective coatings to the finished substrate. Finally, in the step 719, the process ends.

In one embodiment, the substrate has alignment markers on its surface, used to orient and step the beam during the step 711.

While the step 711 describes an ion beam being moved, it will be appreciated that the substrate, rather than the beam, can be moved, such as illustrated in FIGS. 8B and 8C.

Figure 11:
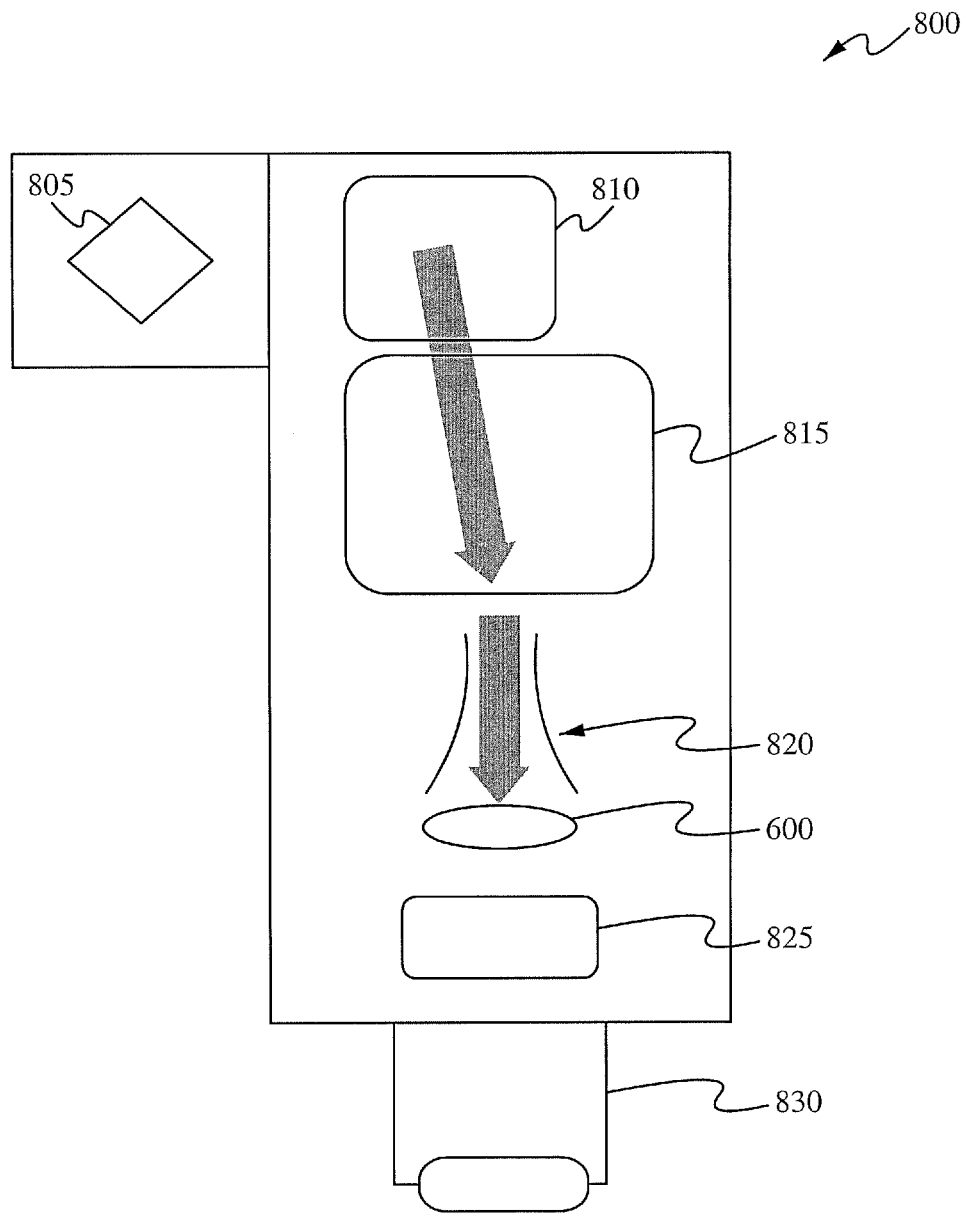
FIG. 11 is a block diagram of a system for fabricating a solar cell in accordance with one embodiment.

FIG. 11 shows a system 800 for fabricating solar cells in accordance with one embodiment. The system 800 includes a single-gas delivery module 805, an ion source 810, an accelerator 815, a skewed Beam Scanning, Mass Analysis, and Beam Shaping module 820, a Measurement and Control module 825, and a single load lock 830 to handle the substrate 600. In another embodiment (not shown), the single-gas delivery module 805 and ion source 810 are replaced with a plasma source module, and the Beam Shaping module 820 is replaced with a spreader for engulfing the substrate 600 with a plasma beam.

In one embodiment, the ion source 810 has a long slot. In alternative embodiments, the ion source 810 includes multiple ion sources for the formation of broad and narrow, or plasma beams. The ion source 810 produces beam currents up to 100 mA of all species but can be dedicated to a single species at one time. The ion source 810 is also plug-compatible for each specific application: when a new application with a different ion beam source is required, the ion source 810 can be pulled out and replaced with a different one that meets requirements (e.g., different dopant) of the next application. The ion source 810 has a beam slot of less than 5 to 10 cm and a width of 1 to 2 mm. Alternatively, the ion source 810 is a plasma source and can be configured to produce a broad beam. The length can be stretched to cover one dimension of a 156 mm×156 mm substrate or both dimensions of the substrate.

In operation, the single-gas delivery module 805 and ion source 810 together generate an ion beam, which is accelerated by the accelerator 815, either in DC fashion or pulsed. In one embodiment, the accelerator has extraction and focusing elements with a limited energy range, such as between 15 and 150 keV. In other embodiments, other limited energy ranges are used. In one embodiment, to limit the energy requirements of the system 800, the accelerator 815 does not operate above 100 keV. In one embodiment, the substrate 600 is inserted into the system 800 after it has been etched, as shown in FIG. 9B.

Next, the resulting skewed beam is controlled using the Beam Scanning, Mass Analyzing, and Shaping module 820 to implant the substrate 600, such as shown in FIGS. 9C-D (for the substrate 600) or as shown in FIGS. 6A, 6B, and 7 (for the substrate 200 of FIG. 2). In one embodiment, the Beam Scanning, Mass Analyzing, and Shaping module 820 includes electrostatic and electromagnetic optics used to focus or shape the beam onto the substrate 600. The beam is further measured and controlled using the Measurement and Control module 825 before or at the same time as the beam impinges on the substrate 600. The substrate 600 can be stepped in front of the beam to implant dopants according to a predetermined pattern, using a single beam to cover the entire surface of the substrate 600. The substrate 600 can also be rotated, translated, and tilted, such as shown in FIGS. 8A-C.

The ion beam can be a broad beam (e.g., 10s of centimeters in diameter) that provides a constant flux of ions across the plane of the substrate 600, that is, scanned across the plane of the substrate 600. The beam is preferably scanned at an even rate across the plane of the substrate 600, across the entire planar and faceted regions. The scanning rate can be altered to achieve varying regions of high doping and low doping by overlapping the Gaussian spread of the beam.

The ion beam causes localized heating. Thus, slow scanning can be used with a wider ion implantation beam and faster scanning can be used with a narrower beam. Multiple passes may be needed to reach the required doping density, such as shown by the three implant steps in FIG. 5.

Preferably, the Beam Scanning, Mass Analyzing, and Shaping module 820 includes logic for doping substrates in accordance with the embodiments. Alternatively, the logic is contained in another element of the system 800. Preferably, the logic includes a memory containing machine-readable instructions for performing process steps (e.g., any one or more of the steps 703, 705, 707, 709, 711, 713, 715, and 717 in FIG. 10) and a processor for executing those steps.

In one embodiment, the substrate 600 is 156 mm×156 mm, but the system 800 is capable of processing wafers of other dimensions. In alternative embodiments, a wafer is deployed before the beam on a moving platen, or one or more wafers on a tray are exposed to the beam or plasma.

Finally, the processed single substrate 600 is removed from the system 800 through the single load lock 830.

It will appreciated that the embodiments described above are merely exemplary. For example, the embodiments show a p-type substrate with an n-type emitter layer. It will be appreciated that an n-type substrate with a p-type emitter layer can also be fabricated in accordance with the embodiments.

The following co-pending patent applications, each of which is incorporated by reference in its entirety, describe different ways of fabricating solar cells: Ser. No. 12/482,980, filed Jun. 11, 2009, titled "Solar Cell Fabrication Using Implantation," by Babak Adibi and Edward S. Murrer, and having Attorney Docket No. SITI-00100; Ser. No. 12/482, 947, filed Jun. 11, 2009, titled "Application Specific Implant System and Method for Use in Solar Cell Fabrications," by Babak Adibi and Edward S. Murrer, and having Attorney Docket No. SITI-00200; and Ser. No. 12/483,017, filed Jun. 11, 2009, titled, "Formation of Solar Cell-Selective Emitter Using Implant and Anneal Method," by Babak Adibi and Edward S. Murrer, and having Attorney Docket No. SITI-00300.

Though the embodiments are directed to solar cells, other embodiments can be used for other types of semiconductor devices, with any number of doping profiles. These distributions include gradual and abrupt distributions, such as box junctions, as well as other distributions that prevent the formation of electrical barriers.

While limitations in the prior art have been discussed, it will be appreciated that each embodiment will not necessarily solve all the limitations. Some embodiments may solve some limitations and other embodiments may solve other ones.

It will be readily apparent to one skilled in the art that other modifications may be made to the embodiments without departing from the spirit and scope of the invention as defined by the appended claims.

What is claimed is:

1. A method of fabricating a solar cell comprising: providing a substrate having non-textured and textured regions, wherein the entire substrate is either p-type or n-type; exposing a surface of the substrate having non-textured and textured regions to a uniform plasma ion beam of dopant ions, thereby using a single ion implant step to implant dopants into the textured regions at a first density and into the non-textured regions at a second density larger than the first density to form gridlines on the non-textured regions; and coupling metallic contact fingers to the gridlines; and wherein exposing the surface comprises engulfing the entire surface of the substrate with the plasma ion beam of dopant ions; and wherein, the dopant ions are of the opposite dopant type to that of the substrate.

2. The method of claim 1, wherein the textured regions each comprise multiple textured elements.

3. The method of claim 2, wherein the multiple textured elements are pyramidal.

4. The method of claim 2, wherein the multiple textured elements are semi-spherical.

5. The method of claim 1, wherein exposing the surface comprises directing the plasma ion beam containing the dopants ions perpendicularly onto the surface.

6. The method of claim 2, wherein the beam is shaped to implant dopants into each of the multiple textured elements individually.

7. The method of claim 1, wherein the textured regions are photo-receptive.

8. The method of claim 2, further comprising rotating a source of the ions, the substrate, or both so that the ion source is substantially perpendicular to faces of each of the multiple textured elements.

9. The method of claim 1, wherein a resistance of the dopant in the non-textured regions is about 20 ohms/square.

10. The method of claim 1, wherein a resistance of the dopant in the textured regions is about 100 ohms/square.

11. The method of claim 1, further comprising implanting metallic ions onto the gridlines and thereafter coupling the metallic contact fingers.

12. The method of claim 11, further comprising forming a silicide between the gridlines and the contact fingers.

13. A method of fabricating a solar cell comprising:
    etching a top surface of a substrate to form textured photo-receptive regions among planar regions, wherein the textured regions comprise pyramidal shaped elements, wherein the entire substrate is either p-type or n-type;
    directing a plasma ion beam of dopants onto the top surface, thereby using a single ion implant step to implant dopants into the textured regions at a first density and into the planar regions at a second density larger than the first density to form gridlines, wherein a resistance of the dopant in the textured regions is less than 100 ohms per square and a resistance of the dopant in the planar regions is about 20 ohms per square;
    coupling contact fingers to the gridlines; and wherein
    directing the plasma ion beam to the top surface comprises engulfing the entire surface of the substrate with the plasma ion beam of dopants;
    and wherein the dopants in the plasma ion beam of dopants are of the opposite dopant type to that of the substrate.

* * * * *